US010756001B2

(12) United States Patent
Kitamura et al.

(10) Patent No.: US 10,756,001 B2
(45) Date of Patent: Aug. 25, 2020

(54) SEMICONDUCTOR MODULE

(71) Applicant: FUJI ELECTRIC CO., LTD., Kanagawa (JP)

(72) Inventors: Akio Kitamura, Matsumoto (JP); Shinichiro Adachi, Matsumoto (JP); Nobuhide Arai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 9 days.

(21) Appl. No.: 16/202,093

(22) Filed: Nov. 28, 2018

(65) Prior Publication Data
US 2019/0148265 A1 May 16, 2019

Related U.S. Application Data

(63) Continuation of application No. PCT/JP2017/039642, filed on Nov. 1, 2017.

(30) Foreign Application Priority Data

Dec. 20, 2016 (JP) .................................. 2016-246597

(51) Int. Cl.
*H01L 23/34* (2006.01)
*H01L 23/473* (2006.01)
(Continued)

(52) U.S. Cl.
CPC ........ *H01L 23/473* (2013.01); *H01L 23/3735* (2013.01); *H01L 23/53209* (2013.01);
(Continued)

(58) Field of Classification Search
CPC ............... H01L 23/473; H01L 23/3675; H01L 2224/48145; H01L 23/3677; H01L 24/83; H01L 33/648
(Continued)

(56) References Cited

U.S. PATENT DOCUMENTS

2001/0014029 A1  8/2001  Suzuki
2010/0090336 A1  4/2010  Yoshida
(Continued)

FOREIGN PATENT DOCUMENTS

JP    2001308246 A    11/2001
JP    2002141164 A    5/2002
(Continued)

OTHER PUBLICATIONS

Extended European Search Report for counterpart European Application No. 178850131, issued by the European Patent Office dated Jun. 17, 2019.
(Continued)

*Primary Examiner* — S. V. Clark

(57) ABSTRACT

Provided is a semiconductor module comprising: a semiconductor chip; a cooling portion having a refrigerant passing portion through which a refrigerant passes; and a laminated substrate having: a first metal interconnection layer; a second metal interconnection layer; and an insulation provided between the first metal interconnection layer and the second metal interconnection layer, wherein the cooling portion has: a top plate; a bottom plate; and a plurality of protruding parts which are provided on a surface of the bottom plate, and are separated from each other in a flow direction of the refrigerant, and are respectively provided continuously in a direction orthogonal to the flow direction, wherein the plurality of protruding parts are provided at a position overlapping with one end of the second metal interconnection layer and at a position overlapping with the semiconductor chip in the flow direction.

14 Claims, 15 Drawing Sheets

(51) Int. Cl.
*H01L 25/07* (2006.01)
*H01L 23/373* (2006.01)
*H01L 25/18* (2006.01)
*H01L 23/532* (2006.01)
*H01L 27/07* (2006.01)

(52) U.S. Cl.
CPC .............. *H01L 25/07* (2013.01); *H01L 25/18* (2013.01); *H01L 27/0711* (2013.01)

(58) Field of Classification Search
USPC ........................................ 257/706, 707, 714
See application file for complete search history.

(56) References Cited

U.S. PATENT DOCUMENTS

| | | |
|---|---|---|
| 2011/0108247 A1 | 5/2011 | Kawaura |
| 2012/0250253 A1 | 10/2012 | Chou |
| 2014/0091453 A1 | 4/2014 | Mori |
| 2014/0239486 A1* | 8/2014 | Gohara ............... H01L 23/3735 257/714 |
| 2015/0008574 A1* | 1/2015 | Gohara ................ H01L 23/473 257/714 |
| 2015/0097281 A1* | 4/2015 | Adachi ................ H01L 23/473 257/714 |
| 2016/0129792 A1* | 5/2016 | Gohara ................ B60L 3/0084 310/54 |
| 2016/0197028 A1* | 7/2016 | Yamada ............... H01L 25/072 257/714 |
| 2018/0024599 A1 | 1/2018 | Sakata |

FOREIGN PATENT DOCUMENTS

| | | |
|---|---|---|
| JP | 2003188326 A | 7/2003 |
| JP | 2008171987 A | 7/2008 |
| JP | 2008172014 A | 7/2008 |
| JP | 2011108683 A | 6/2011 |
| JP | 2013197483 A | 9/2013 |
| JP | 2014033063 A | 2/2014 |
| WO | 2013118869 A1 | 8/2013 |
| WO | 2016194158 A1 | 12/2016 |

OTHER PUBLICATIONS

International Search Report for International Patent Application No. PCT/JP2017/039642, issued by the Japan Patent Office dated Jan. 16, 2018.

* cited by examiner

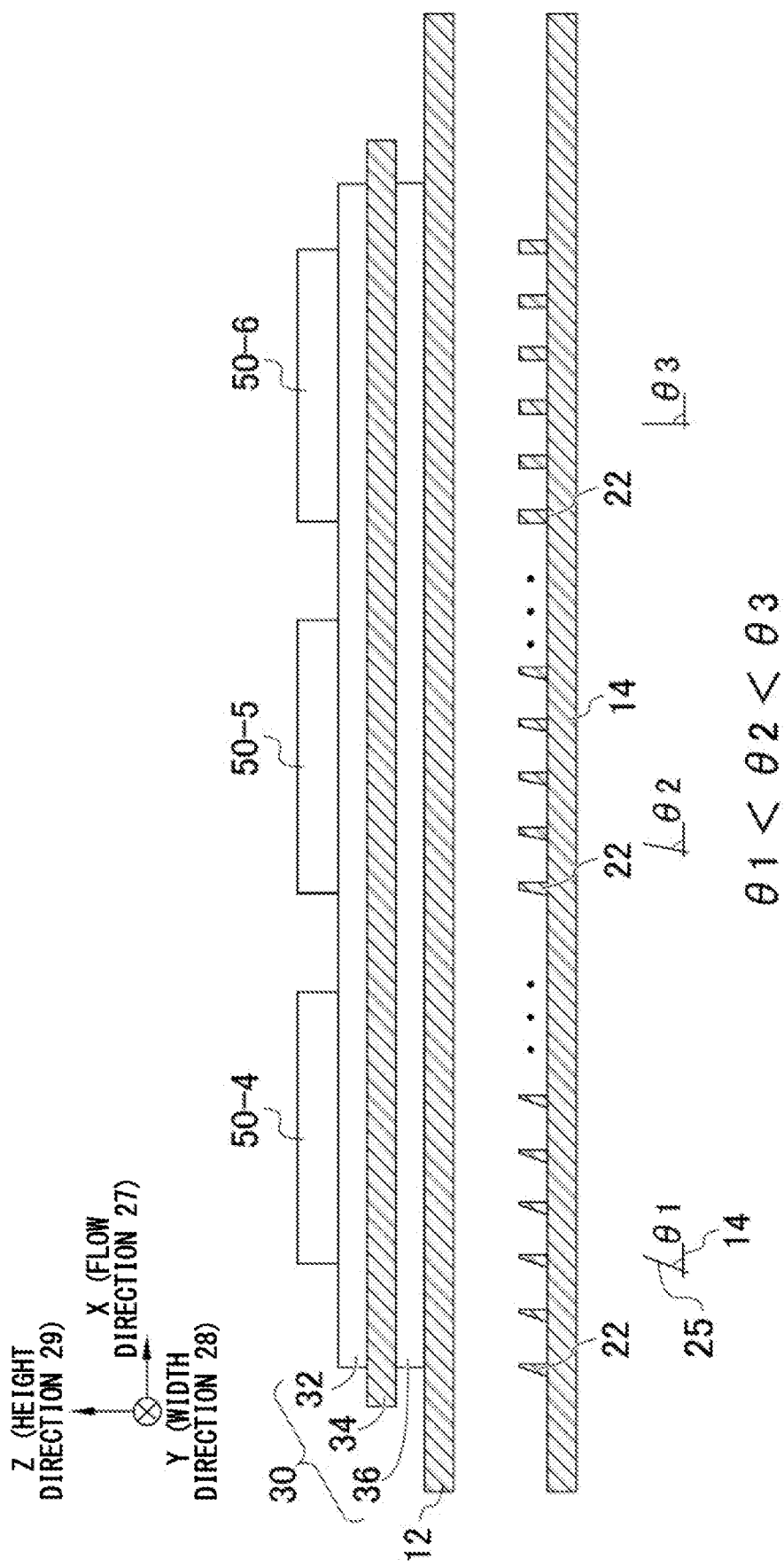

SEMICONDUCTOR MODULE

The contents of the following Japanese patent application(s) are incorporated herein by reference:
NO. 2016-246597 filed in JP on Dec. 20, 2016, and
NO. PCT/JP2017/039642 filed on Nov. 1, 2017.

BACKGROUND

1. Technical Field

The present invention relates to a semiconductor module.

2. Related Art

Conventionally, a cooling structure provided with a protruding part is known (please see, for example, Patent Document 1 and 2). Also, conventionally, a heat sink comprising a laminate of plates having a plurality of slits is known (please see, for example, Patent Document 3).

PRIOR ART DOCUMENTS

Patent Documents

[Patent Document 1] Japanese Patent Application Publication No. 2008-172014
[Patent Document 2] Japanese Patent Application Publication No. 2002-141164
[Patent Document 3] Japanese Patent Application Publication No. 2014-33063

A semiconductor chip is efficiently cooled by electrically insulating the semiconductor chip and a cooling portion that cools heat generated from the semiconductor chip.

SUMMARY

A first aspect of the present invention provides a semiconductor module. The semiconductor module may comprise a semiconductor chip, a cooling portion, and a laminated substrate. The cooling portion may have a refrigerant passing portion inside. The refrigerant may pass through the refrigerant passing portion. The laminated substrate may have a first metal interconnection layer, a second metal interconnection layer, and an insulation. The first metal interconnection layer may be closer to the semiconductor chip than the cooling portion. The second metal interconnection layer may be closer to the cooling portion than the semiconductor chip. The insulation may be provided between the first metal interconnection layer and the second metal interconnection layer. The cooling portion may have a top plate, a bottom plate, and a plurality of protruding parts. The top plate may be provided close to the laminated substrate. The bottom plate may be provided facing the top plate. The plurality of protruding parts may be provided on a surface of the bottom plate contacting the refrigerant passing portion. The plurality of protruding parts may be separated from each other in a flow direction from an upstream to a downstream of the refrigerant. The plurality of protruding parts may be respectively provided continuously in a width direction of the refrigerant passing portion orthogonal to the flow direction. The plurality of protruding parts may be at least provided at a position overlapping with one end of the second metal interconnection layer in the flow direction and at a position overlapping with the semiconductor chip.

The second metal interconnection layer may be provided on the top plate. The insulation may be provided above the second metal interconnection layer. The first metal interconnection layer may be provided above the insulation. The semiconductor chip may be provided on the first metal interconnection layer.

In two protruding parts among the plurality of protruding parts, height of a protruding part provided at a position close to the downstream may be higher than height of a protruding part provided at a position close to the upstream.

An interval between two protruding parts provided at a position close to the downstream among the plurality of protruding parts may be narrower than an interval between two protruding parts provided at a position close to the upstream among the plurality of protruding parts.

The plurality of protruding parts may respectively have a front surface. The front surface may face a flow of the refrigerant from the upstream. In two protruding parts among the plurality of protruding parts, an inclination angle in a protruding part provided at a position close to the downstream may be larger than an inclination angle in a protruding part provided at a position close to the upstream. The inclination angle may be an angle of the front surface with respect to the bottom plate.

The cooling portion may have an upper refrigerant passing portion and a lower refrigerant passing portion. The upper refrigerant passing portion and the lower refrigerant passing portion respectively may have the plurality of protruding parts. The upper refrigerant passing portion may be provided at a position relatively close to the second metal interconnection layer in a height direction from the bottom plate to the top plate. The lower refrigerant passing portion may be provided overlapping under the upper refrigerant passing portion in the height direction.

The plurality of protruding parts in the upper refrigerant passing portion and the plurality of protruding parts in the lower refrigerant passing portion may not overlap with each other in the height direction.

Each of the plurality of protruding parts in the upper refrigerant passing portion and each of the plurality of protruding parts in the lower refrigerant passing portion may overlap with each other in the height direction.

The upper refrigerant passing portion may exchange heat with the laminated substrate. The upper refrigerant passing portion may exchange heat with the lower refrigerant passing portion.

Any one or more of the following (a), (b) and (c) may be satisfied in the plurality of protruding parts of the upper refrigerant passing portion. (a) in two protruding parts among the plurality of protruding parts in the upper refrigerant passing portion, height of a protruding part provided at a position close to the downstream is higher than height of a protruding part provided at a position close to the upstream. (b) an interval between two protruding parts provided at a position close to the downstream among the plurality of protruding parts in the upper refrigerant passing portion is narrower than an interval between two protruding parts provided at a position close to the upstream among the plurality of protruding parts in the upper refrigerant passing portion. (c) each of the plurality of protruding parts has a front surface facing a flow of the refrigerant from the upstream, in two protruding parts among the plurality of protruding parts in the upper refrigerant passing portion, an inclination angle of the front surface with respect to the bottom plate in a protruding part provided at a position close to the downstream is larger than an inclination angle of the front surface with respect to the bottom plate in a protruding part provided at a position close to the upstream.

The semiconductor chip may be an RC-IGBT semiconductor chip. The RC-IGBT semiconductor chip may have an IGBT region and an FWD region. The IGBT region and the FWD region may be provided in a stripe shape. An extending direction of the plurality of protruding parts in the width direction may be parallel to a longitudinal direction of the IGBT region and the FWD region.

The semiconductor module may further comprise an additional semiconductor chip at a position different from the semiconductor chip in the flow direction. At least one of the plurality of protruding parts may be provided between the semiconductor chip and the additional semiconductor chip.

In the cooling portion, the top plate and the bottom plate may be integrated via side plates provided between the top plate and the bottom plate in a height direction from the bottom plate toward the top plate.

Thickness of the first metal interconnection layer and the second metal interconnection layer may be 0.6 mm or more.

The summary clause does not necessarily describe all necessary features of the embodiments of the present invention. The present invention may also be a sub-combination of the features described above.

BRIEF DESCRIPTION OF THE DRAWINGS

FIG. 4C shows an example in which inclination angle θ of a front surface 25 of a protruding part 22 changes in a flow direction 27.

DESCRIPTION OF EXEMPLARY EMBODIMENTS

Hereinafter, (some) embodiments) of the present invention will be described. The embodiment(s) do(es) not limit the invention according to the claims, and all the combinations of the features described in the embodiments) are not necessarily essential to means provided by aspects of the invention.

Figure 1:
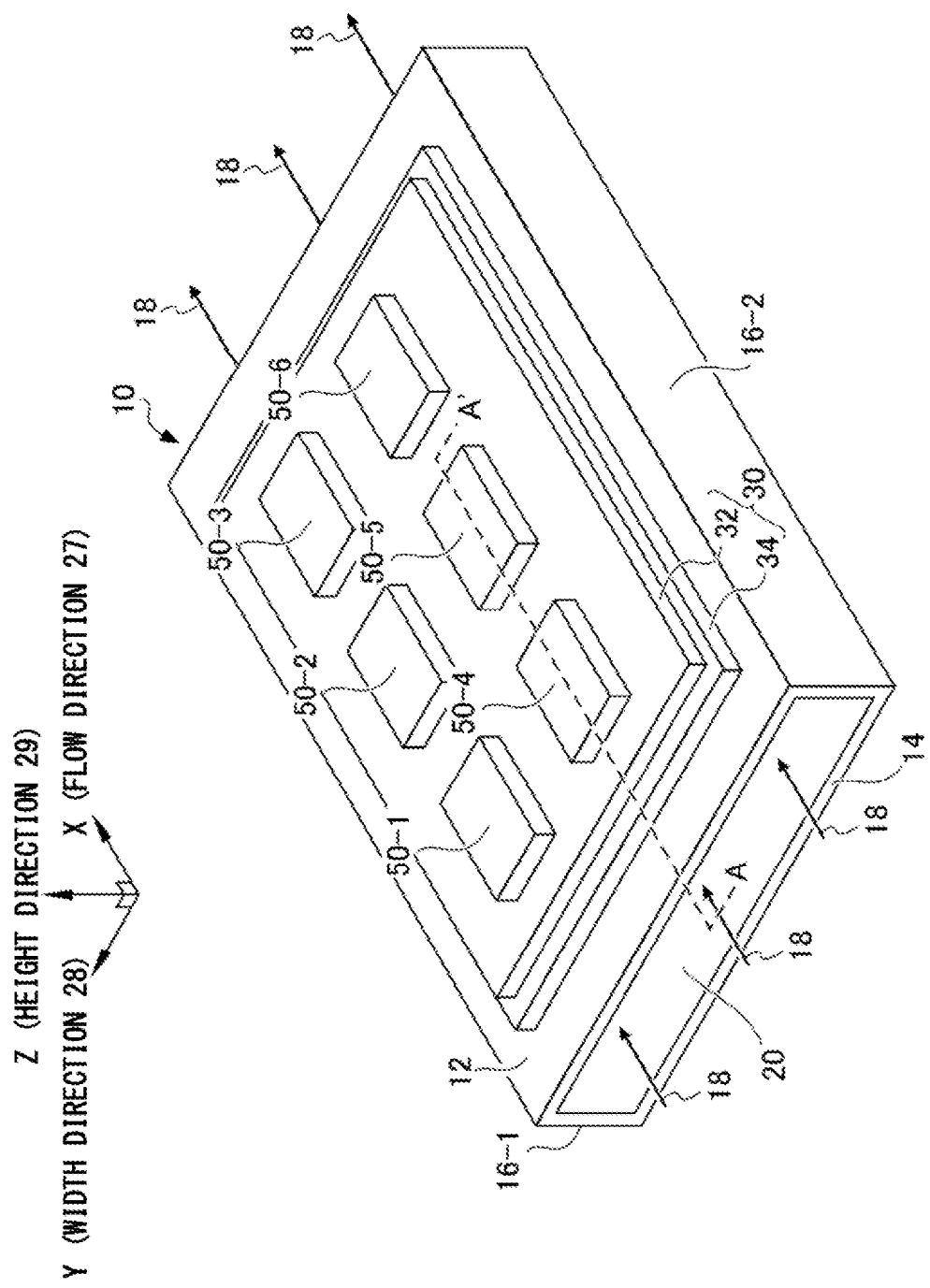
FIG. 1 is a perspective view schematically showing a semiconductor module 100 according to an embodiment of the present invention.

FIG. 1 is a perspective view schematically showing a semiconductor module 100 according to an embodiment of the present invention. The semiconductor module 100 of the present example includes a cooling portion 10; a laminated substrate 30; a plurality of semiconductor chips 50-1, 50-2, 50-3; and a plurality of semiconductor chips 50-4, 50-5, 50-6. Note that, the semiconductor module 100 may include other members such as a wire, a terminal, a case, and a fixture as necessary, which are omitted in FIG. 1.

The cooling portion 10 has a function to cool heat from the semiconductor chip 50. Apart of the cooling portion 10 of the present example has a rectangular parallelepiped shape. In the present example, a rectangular parallelepiped shape of the cooling portion 10 is constituted by integrating the top plate 12 and the bottom plate 14, which face each other, and the two side plates 16 provided between the top plate 12 and the bottom plate 14.

In contrast, a cooling portion 10 of the comparative example, in which a top plate 12 and a fin structure are integrated, but the top plate 12 and a bottom plate 14 are not integrated, is considered. In the cooling portion 10 of this comparative example, the fin structure is located in a refrigerant passing portion 20. In the case of this comparative example, in order to ensure the rigidity of the cooling portion 10, thickness of the top plate 12 needs to be 4 mm or more. Furthermore, thickness of the bottom plate 14 also needs to be 5 mm or more, 10 mm or less. For the cooling portion 10 of the comparative example, refer to FIG. 5 described below.

In contrast, in the cooling portion 10 of the present example, mechanical strength of the cooling portion 10 can be ensured by integrating the top plate 12, the bottom plate 14, and the side plate 16. Therefore, in the cooling portion 10 of the present example, the top plate 12 can be made thinner compared to the cooling portion 10 of the above-mentioned comparative example. In the present example, thickness of the top plate 12 (that is, the length in the Z direction) may be 2 mm or less, or may be 1 mm. In this manner, in the present example, because the cooling portion 10 can be miniaturized compared to that of the comparative example, the semiconductor module 100 can be miniaturized.

The top plate 12, the bottom plate 14, and the side plate 16 of the cooling portion 10 may be formed of metal having relatively high thermal conductivity. The top plate 12, the bottom plate 14, and the side plate 16 of the present example are formed of copper (Cu) or aluminum (Al). By forming the cooling portion 10 with metal having a relatively high thermal conductivity, heat exchange between the refrigerant 18 and the cooling portion 10 can be promoted compared to the case where the cooling portion 10 is formed with an insulation having a relatively low thermal conductivity and the like.

The cooling portion 10 of the present example has a refrigerant passing portion 20 inside. The refrigerant passing portion 20 of the present example is a hollowed portion through which the refrigerant 18 passes. The refrigerant 18 flows through the refrigerant passing portion 20 from upstream toward downstream. In the present example, the negative direction of the X axis is the upstream of the refrigerant 18, and the positive direction of the X axis is the downstream of the refrigerant 18. In FIG. 1, a flow direction 27 in which the refrigerant 18 flows is parallel to the X axis direction. Note that, the flow direction 27 is a perspective flow direction of the refrigerant 18 through the refrigerant passing portion 20, and is not a local flow direction.

Also, a width direction 28 of the refrigerant passing portion 20 in the present example is a direction parallel to the Y axis direction. The width direction 28 is orthogonal to the flow direction 27. The width direction 28 is also a direction from the side plate 16-2 located in the negative direction of the Y axis to the side plate 16-1 located in the positive direction of the Y axis. Furthermore, in the present example, a height direction 29 from the bottom plate 14 to the top plate 12 is a direction parallel to the Z axis direction.

The Z axis of the present example is an axis orthogonal to the X axis and the Y axis. The X axis, the Y axis, and the Z axis of the present example constitute a right hand system. The X axis, the Y axis, and the Z axis are used to show a relative direction of the semiconductor module 100. The Z axis direction may not necessarily be parallel to the gravitational direction. As used herein, directions indicated by the terms "upper", "lower", "above", and "below" are not limited to upper and lower directions in the gravitational direction. These terms merely refer to relative directions with respect to the Z axis.

The laminated substrate 30 of the present example is provided on the top plate 12 close to the top plate 12 of the cooling portion 10. The laminated substrate 30 of the present example has a first metal interconnection layer 32, an insulation 34, and a second metal interconnection layer. Lengths in the X axis direction and the Y axis direction of the first metal interconnection layer 32 and the second metal interconnection layer of the present example are smaller compared to those of the insulation 34. Therefore, in FIG. 1, the second metal interconnection layer is hidden by the insulation 34, and is not indicated. The second metal interconnection layer is provided between the insulation 34 and the top plate 12 of the cooling portion 10.

A plurality of semiconductor chips 50 may be provided on the first metal interconnection layer 32. The first metal interconnection layer 32 may include interconnection for electrically connecting between the plurality of semiconductor chips 50. The first metal interconnection layer 32 may include a plurality of interconnections or regions which are electrically insulated from each other. The first metal interconnection layer 32 may be an interconnection layer formed of copper (Cu) or aluminum (Al). Thickness of the first metal interconnection layer 32 may be 0.6 mm or more. Because the thickness is 0.6 mm or more, thermal dissipation properties from the semiconductor chip 50 can be improved. The first metal interconnection layer 32 of the present example is a copper interconnection layer having thickness of 0.8 mm.

The insulation 34 may be an insulated substrate provided between the first metal interconnection layer 32 and the second metal interconnection layer. The insulation 34 may be made of a sintered product of silicon nitride ($SiN_x$), aluminum nitride ($AlN_x$) or aluminum oxide ($Al_2O_3$).

The insulation 34 may have a function to ensure electrical insulation between the semiconductor chip 50 through which a large current flows and the metallic cooling portion 10. Thereby, even if the entire cooling portion 10 is formed of metal, electrical insulation between the semiconductor chip 50 and the cooling portion 10 is ensured. Compared to the case where a part of the cooling portion 10 or the entire cooling portion 10 is formed of an insulation, if the entire cooling portion 10 is formed of metal, advantages can be obtained with respect to heat exchange between the top plate 12 and the refrigerant 18, and the manufacturing process and the manufacturing cost of the cooling portion 10 and the like.

Figure 2:
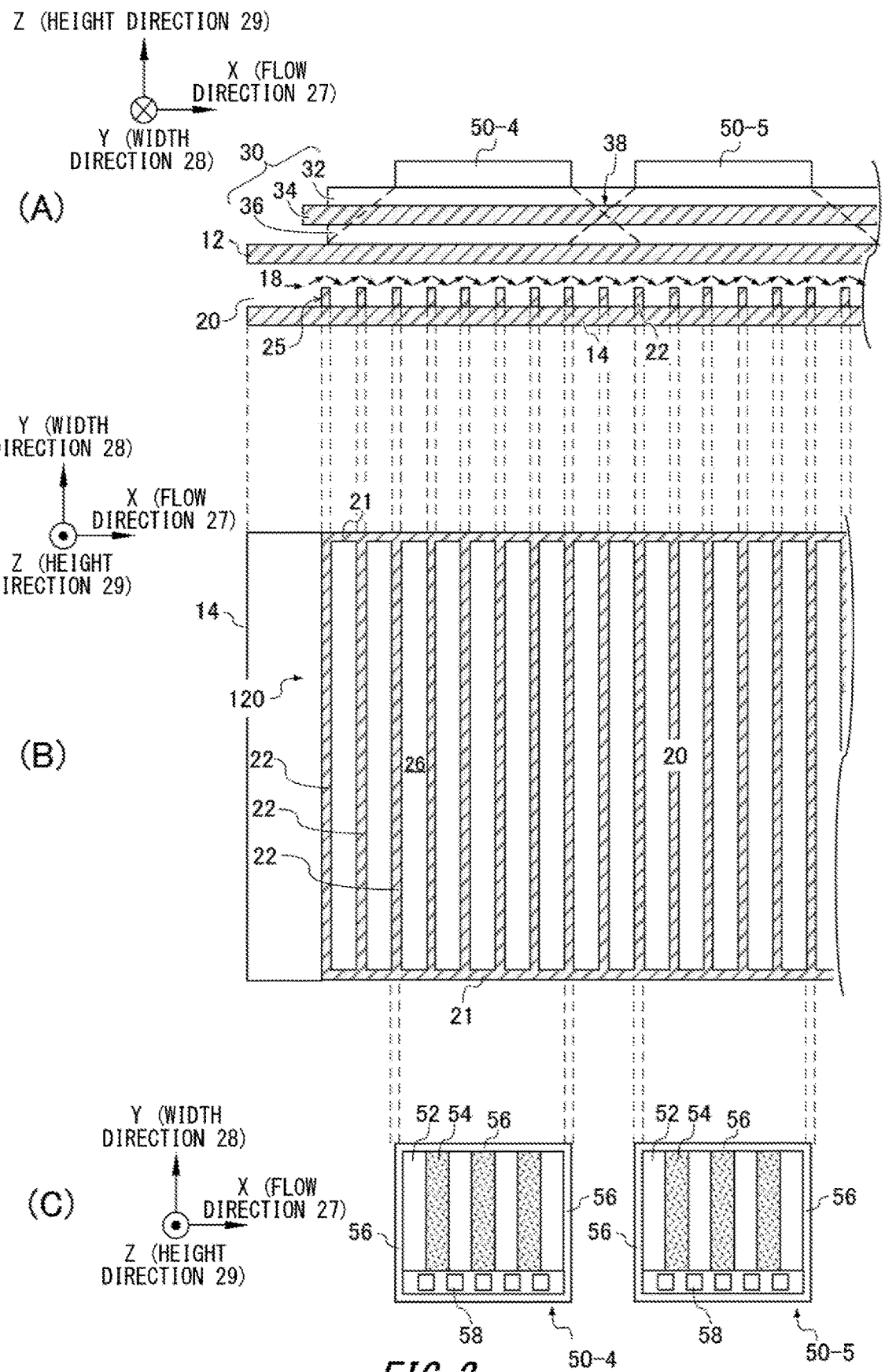
FIG. 2 is a diagram in which (A) is a cross-sectional view taken along line A-A in a first embodiment;
(B) is a top view of a refrigerant passing portion 20; and
(C) is a top view of a semiconductor chip 50.

In FIG. 2, (A) is a cross-sectional view taken along line A-A in a first embodiment. In FIG. 2, (B) is a top view of a refrigerant passing portion 20. In FIG. 2, (C) is a top view of a semiconductor chip 50.

The second metal interconnection layer 36 of the laminated substrate 30 may be fixed on the top plate 12 via a solder portion. The second metal interconnection layer 36 may also be an interconnection layer formed of copper (Cu) or aluminum (Al). The second metal interconnection layer 36 and the first metal interconnection layer 32 may have the same volume. This can suppress cracks, which are generated in the insulation 34 because stress is applied to the insulation 34 due to a difference in an amount of warping caused by thermal deformation of the first metal interconnection layer 32 and the second metal interconnection layer 36. As a result, insulation reliability of the insulation 34 can be ensured.

In the second metal interconnection layer 36, the interconnection within the layer may be densely provided compared to the first metal interconnection layer 32. Therefore, thickness of the second metal interconnection layer 36 may be thinner compared to that of the first metal interconnection layer 32. Thickness of the second metal interconnection layer 36 may also be 0.6 mm or more. Because the thickness is 0.6 mm or more, thermal dissipation properties from the semiconductor chip 50 can be improved. The second metal interconnection layer 36 of the present example is a copper interconnection layer having thickness of 0.75 mm.

The semiconductor chip 50 of the present example may be formed of silicon carbide (SiC), or may be formed of silicon (Si). The semiconductor chip 50 generates heat during operation (for example, when it is in the ON state). The heat of the semiconductor chip 50 is conveyed from the first metal interconnection layer 32 closer to the semiconductor chip than to the cooling portion 10, via the insulation 34, to the second metal interconnection layer 36 closer to the cooling portion 10 than the semiconductor chip 50. The spread of heat conveyed from the semiconductor chip 50 to the laminated substrate 30 is indicated by dashed lines.

The cooling portion 10 of the present example has a plurality of protruding parts 22. The plurality of protruding parts 22 may be provided on a surface of the bottom plate 14 contacting the refrigerant passing portion 20. The plurality of protruding parts 22 may be separated from each other in the flow direction 27. In the present example, the plurality of protruding parts 22 are provided at intervals of 2.4 mm in the flow direction 27.

The plurality of protruding parts 22 may be provided being separated from the top plate 12. The plurality of protruding parts 22 of the present example have height of 1 mm from the bottom plate 14 in the height direction 29. Also, in the present example, the spacing between the upper portions of the plurality of protruding parts 22 and the top plate 12 is 1 mm.

By a part of the refrigerant 18, which is passing through the refrigerant passing portion 20, colliding with the front surface 25 of the protruding part 22, the part of the refrigerant 18 flows toward the top plate 12 above the protruding part 22. The flow of the refrigerant 18 above the protruding part 22 may have a vector component oriented in the height direction 29 by a predetermined angle with respect to the flow direction 27. In (A) of FIG. 2, the upward vector components are show by arrows. The flow of the refrigerant 18 having an upward vector component exchanges heat with the top plate 12 by hitting the top plate 12. Thereby, the refrigerant 18 can cool the laminated substrate 30 and the semiconductor chip 50. The refrigerant 18 of the present example can more efficiently cool the laminated substrate 30 and the semiconductor chip 50, compared to the case where the entire refrigerant 18 flows in parallel with the flow direction 27.

One of the protruding parts 22 may be provided at a position at which it overlaps with one end of the second metal interconnection layer 36 in the flow direction 27, when viewed from above of the Z axis direction. By further cooling immediately below the end portion of the second metal interconnection layer 36, degradation of the solder layer in the heat cycle can be suppressed. This can make the lifetime of the semiconductor module 100 longer compared to the case where no protruding part 22 is provided immediately below the end portion of the second metal interconnection layer 36. Note that, the one end of the second metal interconnection layer 36 may be parallel to the Y axis (the width direction 28).

Also, the protruding part 22 may be provided at least at a position at which it overlaps with the semiconductor chip 50. In the present example, two or more protruding parts 22 are provided under the semiconductor chip 50. Thereby, the semiconductor chip 50 can be efficiently cooled according to the thermal spread distribution of the laminated substrate 30.

The plurality of semiconductor chips 50 may be provided at different positions in the flow direction 27. In (A) of FIG. 2, The semiconductor chip 50-4 and the semiconductor chip 50-5 are provided at different positions in the flow direction 27. The heat generated from the semiconductor chip 50 diffuses in the X axis direction and the Y axis direction as going downward of the laminated substrate 30. As a result, a thermal interference region 38 where the heats from the two adjacent semiconductor chips 50 interfere is formed. In (A) of FIG. 2, a thermal interference region 38 is formed between the semiconductor chip 50-4 and the semiconductor chip 50-5. The temperature of the thermal interference region 38 is higher compared to those of other regions of the laminated substrate 30.

In order to cool the thermal interference region 38, at least one protruding part 22 may be provided between two adjacent semiconductor chips 50 in the flow direction 27. In the present example, one or more protruding parts 22 is(are) provided immediately below the space between the semiconductor chip 50-4 and the semiconductor chip 50-5. Thereby, the thermal interference region 38 can be more efficiently cooled compared to the case where no protruding part 22 is provided between the semiconductor chips 50-4 and 50-5.

As shown in (B) in FIG. 2, the plurality of protruding parts 22 of the present example are a part of the plate with openings 120. The plate with openings 120 may have a plurality of protruding parts 22 and a plurality of side portions 21. The plate with openings 120 of the present example has one set of side portions 21 at both end portions in the Y axis direction, and a plurality of protruding parts 22. The protruding parts 22 of the present example extend in the width direction 28. In contrast, the side portions 21 of the present example extend in parallel with the flow direction 27.

As shown in (B) in FIG. 2, each of the plurality of protruding parts 22 is continuous in the width direction 28. That is, the protruding part 22 is provided between the side portions 21 adjacent to each other in the width direction 28 not discretely but continuously. In the present example, when using a pump having a predetermined displacement, it is possible to lower the pressure loss at the cooling portion 10 compared to the case where the refrigerant passing portion 20 is divided into a plurality of independent regions in the width direction 28.

Note that, in the plate with openings 120 of the present example, two adjacent protruding parts 22 in the flow direction 27 and two adjacent side portions 21 in the width direction 28 form one opening portion 26. The opening portion 26 exposes the bottom plate 14 to the refrigerant passing portion 20. The side portion 21 may have the same height as the protruding part 22, and may be provided from the bottom plate 14 to the top plate 12.

As shown in (C) in FIG. 2, the semiconductor chip 50 of the present example is an RC-IGBT (Reverse Conducting IGBT) semiconductor chip. The RC-IGBT semiconductor chip of the present example has an IGBT (Insulated Gate Bipolar Transistor) region 52 and a FWD (Free Wheeling Diode) region 54 provided in a stripe shape. Note that, the stripe of the present example extends in parallel with the width direction 28. For ease of understanding, dots are applied to the FWD regions 54.

In the RC-IGBT semiconductor chip of the present example, the IGBT regions 52 and the FWD regions 54 are alternately provided in the flow direction 27. Also, the RC-IGBT of the present example has an edge termination region 56 so as to surround the IGBT region 52 and the FWD region 54 in the X-Y plane. The edge termination region 56 may have a function to mitigate electric field concentration in the IGBT region 52 and the FWD region 54.

ON/OFF of the gate of the IGBT region 52 may be controlled by a control signal input from outside via the control electrode pad 58. When the IGBT region 52 is in the ON state by the control signal, because a current flows through the IGBT region 52, the IGBT region 52 generates heat. On the other hand, when the IGBT region 52 is in the OFF state by the control signal, because a current flows through the FWD region 54, the FWD region 54 generates heat.

In this manner, in the RC-IGBT semiconductor chip of the present example, according to the ON/OFF of the IGBT region 52, the IGBT region 52 and the FWD region 54 alternately generate heat. That is, during use of the semiconductor module 100, the RC-IGBT semiconductor chip of the present example generates heat both when the IGBT region 52 is in the ON state and the OFF state. When the semiconductor chip 50 is an RC-IGBT semiconductor chip, the loss per one semiconductor chip 50 is, for example, 300 W or more. Note that, when the IGBT region 52 generates heat, the FWD region 54 and the edge termination region 56 may have a function to diffuse heat. In the same manner, when the FWD region 54 generates heat, the IGBT region 52 and the edge termination region 56 may have a function to diffuse heat.

The semiconductor chip 50 of the present example has a long side parallel to the flow direction 27 and a short side parallel to the width direction 28. The length of the long side of the semiconductor chip 50 of the present example is 14 mm. Regarding this, in the present example, because the interval between the adjacent protruding parts 22 in the flow direction 27 is 2.4 mm, five or six protruding parts 22 may be located immediately below the semiconductor chip 50.

In the present example, the plurality of protruding parts 22 extend parallel to a longitudinal direction of the IGBT region 52 and the FWD region 54. Thereby, the protruding part 22 can cool the semiconductor chip 50 across the entire width direction 28.

Compared to the case where the semiconductor chip 50 having only the IGBT region 52 and the semiconductor chip 50 having only the FWD region 54 are provided on the laminated substrate 30, the range in which heat is diffused from the semiconductor chips 50-4 and 50-5 to the laminated substrate 30 of the present example is wider in the flow direction 27. In the present example, a plurality of protruding parts 22 are provided at predetermined intervals from immediately below the end portion in the upstream side of the second metal interconnection layer 36 to immediately below the end portion in the downstream side of the second metal interconnection layer 36. As a result, all of the RC-IGBT semiconductor chips located on the laminated substrate 30 can be efficiently cooled.

Also, when the two semiconductor chips 50 are RC-IGBT semiconductor chips, the above-described thermal interference region 38 is formed. In the present example, a protruding part 22 is also provided immediately below the thermal interference region 38 between the semiconductor chip 50-4 and the semiconductor chip 50-5. Thereby, because the thermal interference region 38 can be cooled, the plurality of semiconductor chips 50 can be cooled more efficiently compared to the case where no protruding part 22 is provided immediately below the thermal interference region 38. As a result, immediately below the thermal interference region 38 as well, it possible to reduce the thermal load on the solder layer between the second metal interconnection layer 36 and the top plate 12.

Figure 3:
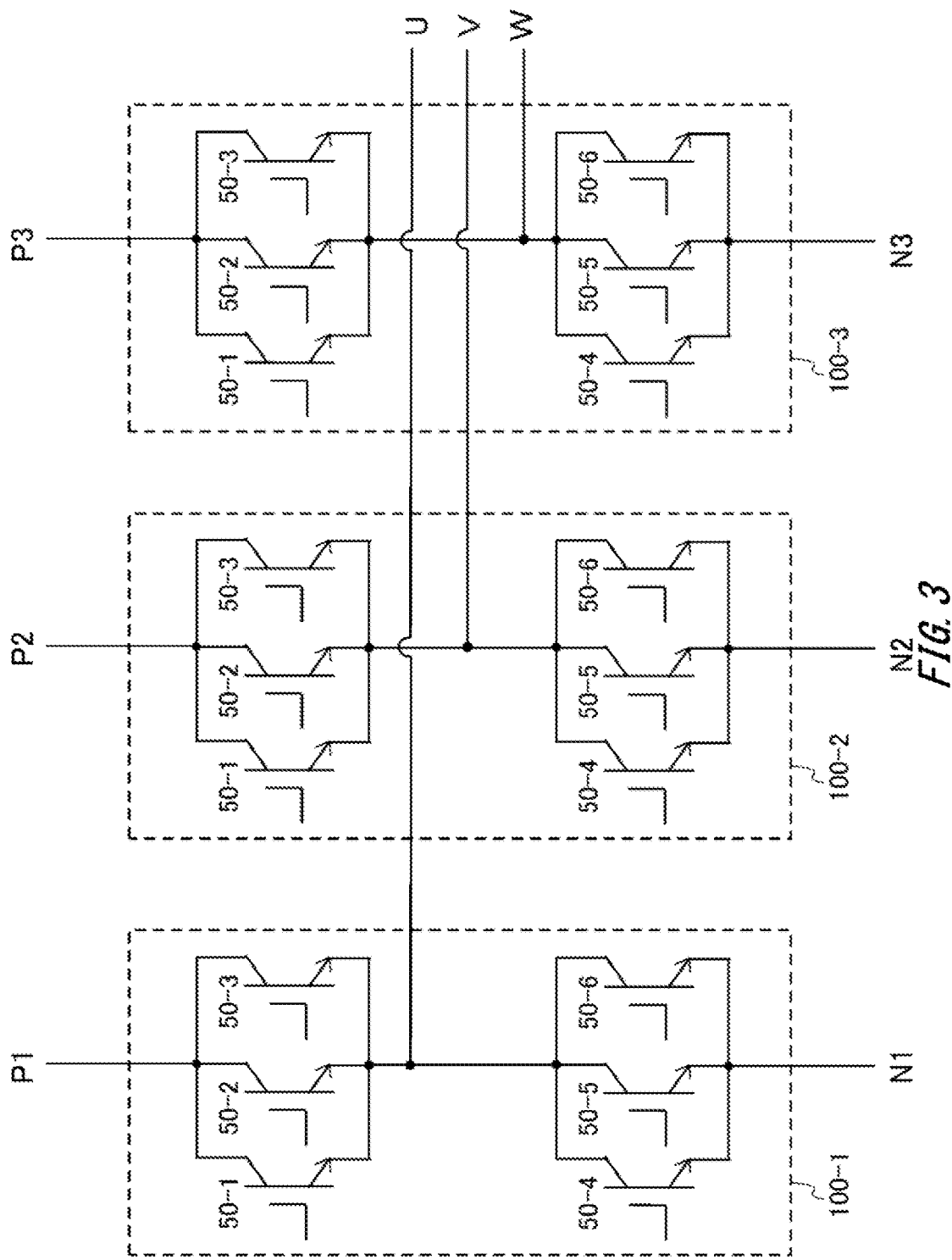
FIG. 3 is a circuit diagram of an inverter circuit having a plurality of semiconductor modules 100.

FIG. 3 is a circuit diagram of an inverter circuit having a plurality of semiconductor modules 100. In a semiconductor module 100-1, the plurality of semiconductor chips 50-1, 50-2 and 50-3 and the plurality of semiconductor chips 50-4, 50-5 and 50-6 are RC-IGBT semiconductor chips, respectively. In this case, the collector electrodes and the emitter electrodes of the semiconductor chips 50-1, 50-2 and 50-3 may be connected in parallel, respectively electrically, to the input terminal P1 and the output terminal U, and the collector electrodes and emitter electrodes of the semiconductor chips 50-4, 50-5 and 50-6 may be connected in parallel, respectively electrically, to the output terminal U and the other input terminal N1. Note that, the control electrode pads 58 of the plurality of semiconductor chips 50-1, 50-2 and 50-3 and the control electrode pads 58 of the plurality of semiconductor chips 50-4, 50-5 and 50-6 may be respectively arranged in a direction separating in the Y axis direction and arranged in a direction aligned in the flow direction 27 (X axis direction) (for the control electrode pad 58, see (A) and (C) of FIG. 2).

The plurality of semiconductor chips 50-1, 50-2 and 50-3 and the plurality of semiconductor chips 50-4, 50-5 and 50-6 may be alternately switched by signals input to the control electrode pad 58, and may also generate heat. The input terminal P1 may be connected to the positive side of the external power supply, the other input terminal N1 may be connected to the negative side, and the output terminal U may be connected to the load. The plurality of semiconductor chips 50-1, 50-2 and 50-3 may constitute an upper arm in the inverter circuit, and the plurality of semiconductor chips 50-4, 50-5 and 50-6 may constitute a lower arm in the same inverter circuit. A plurality of semiconductor chips 50 included in each arm, may be three like in the present example, or may be one, or may be two, or may be four or more. For example, about 20 semiconductor chips 50 formed of silicon carbide may be included. The first metal interconnection layer 32 may include a first region, and a second region that is different from the first region and is electrically insulated from the first region. Also, a plurality of semiconductor chips 50 constituting the upper arm may be provided in the first region, and a plurality of semiconductor chips 50 constituting the lower arm may be provided in the second region.

The semiconductor modules 100-2 and 100-3 also have configurations similar to that of the semiconductor module 100-1. However, in the semiconductor module 100-2, the collector electrodes and the emitter electrodes of the semiconductor chips 50-1, 50-2 and 50-3 may be connected respectively electrically to the input terminal P2 and the output terminal V, and the collector electrodes and emitter electrodes of the semiconductor chips 50-4, 50-5 and 50-6 may be connected respectively electrically to the output terminal V and the other input terminal N2. Also, in the semiconductor module 100-3, the collector electrodes and the emitter electrodes of the semiconductor chips 50-1, 50-2 and 50-3 may be connected respectively electrically to the input terminal P3 and the output terminal W, and the collector electrodes and emitter electrodes of the semiconductor chips 50-4, 50-5 and 50-6 may be connected respectively electrically to the output terminal W and the other input terminal N3. The input terminals P1, P2, and P3 may be electrically connected to each other. Also, the other input terminals N1, N2, and N3 may be electrically connected to each other. The inverter circuit of the present example may function as a three-phase alternating inverter circuit having output terminals U, V, and W. The semiconductor module 100-1, semiconductor modules 100-2 and 100-3 may be integrated with each other, by being connected to each other, or by being mounted on a case.

Figure 4A:
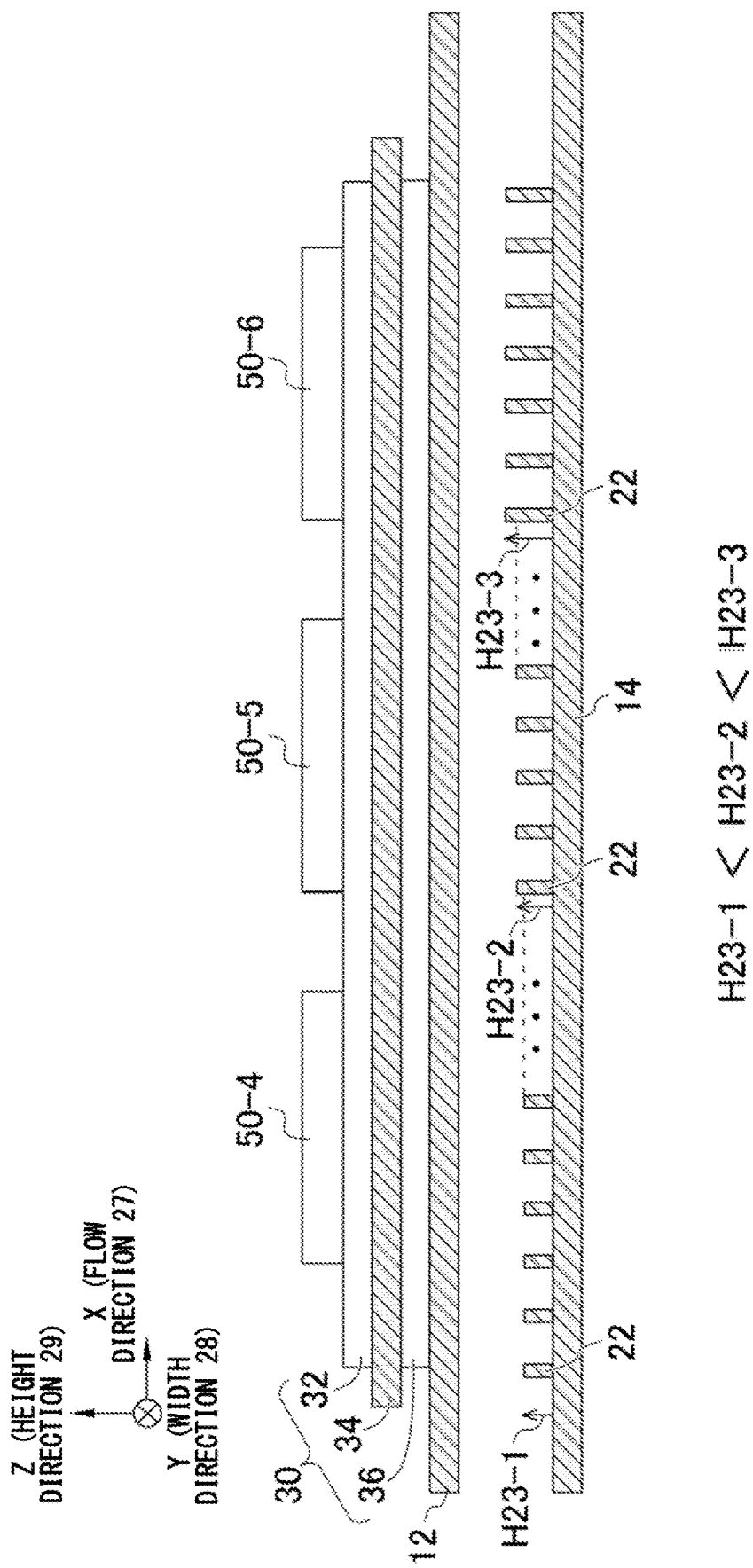
FIG. 4A shows an example in which height H23 of a protruding part 22 changes in a flow direction 27.

FIG. 4A shows an example in which height H23 of a protruding part 22 changes in a flow direction 27. The height H23 of the protruding part 22 provided at a position close to the downstream may be higher than the height H23 of the protruding part 22 provided at a position close to the upstream. Note that, in the present example, the portion immediately below the semiconductor chip 50-4 is the upstream, the portion immediately below the semiconductor chip 50-5 is the midstream, and the portion immediately below the semiconductor chip 50-6 is the downstream. In the present example, the height H23-2 of the protruding part 22 in the midstream is higher than the height H23-1 of the protruding part 22 in the upstream. Also, the height H23-3 of the protruding part 22 in the downstream is higher than the height H23-2 of the protruding part 22 in the midstream. Furthermore, the height H23-3 of the protruding part 22 in the downstream is higher than the height H23-1 of the protruding part 22 in the upstream.

The height H23 of the protruding part 22 may gradually increase from the upstream toward the downstream. Also, the height H23 of the protruding part 22 may be constant within each region in the upstream, in the midstream, and in the downstream, and may increase in a step-by-step manner as it heads to the region in the downstream. Also, the height H23 of the protruding part 22 may have a two-step height change between the upstream and the midstream (low) and the downstream (high), or may have a two-step height change between the upstream (low) and the midstream and the downstream (high).

As the refrigerant 18 heads closer to the downstream, the heat accumulated in the upstream increases. Therefore, the cooling function of the cooling portion 10 may fall toward the downstream. the larger its flow velocity is, the cooling portion 10 can improve its cooling function. Note that, the narrower the space through which the refrigerant 18 flows, the larger the pressure loss may become.

In the present example, because the height H23 of the protruding part 22 is higher toward the downstream, compared to the case where the heights H23 of all the protruding parts 22 are the same as the height H23-3 of the protruding part 22 in the downstream, it is possible to reduce the pressure loss within the refrigerant passing portion 20 and to prevent a deterioration in the cooling efficiency in the downstream.

Figure 4B:
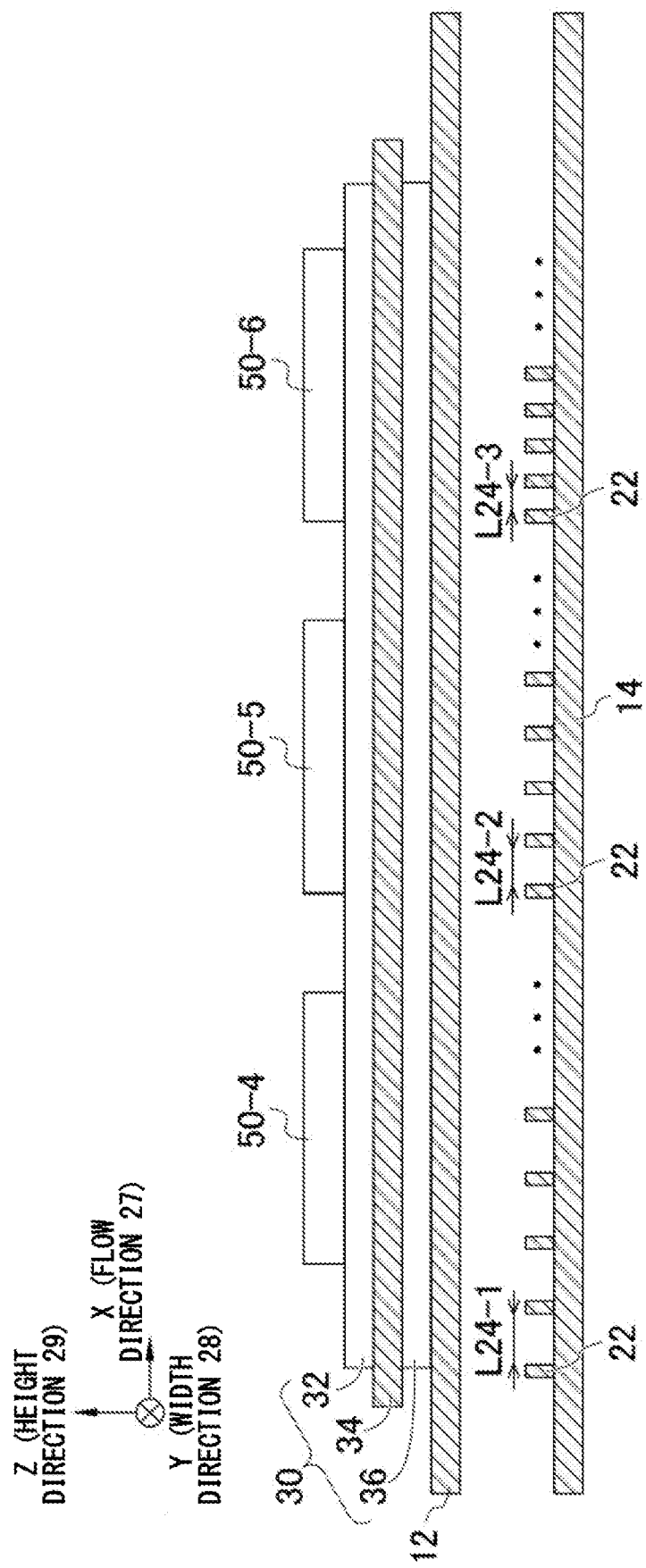
FIG. 4B shows an example in which interval L24 of a protruding part 22 changes in a flow direction 27.

FIG. 4B shows an example in which interval L24 of a protruding part 22 changes in a flow direction 27. The interval L24 of the two adjacent protruding parts 22 provided at a position close to the downstream may be narrower than the interval L24 of the two adjacent protruding parts 22 provided at a position close to the upstream. In the present example, the interval L24-2 of the protruding parts 22 in the midstream is narrower than the interval L24-1 of the protruding parts 22 in the upstream. Also, the interval L24-3 of the protruding parts 22 in the downstream is narrower than the interval L24-2 of the protruding parts 22 in the midstream. Furthermore, the interval L24-3 of the protruding parts 22 in the downstream is narrower than the interval L24-1 of the protruding parts 22 in the upstream.

The interval L24 of the protruding parts 22 may gradually decrease from the upstream toward the downstream. Also, the interval L24 of the protruding part 22 may be constant within each region in the upstream, in the midstream, and in the downstream, and may increase in a step-by-step manner toward the region in the downstream. Also, the interval L24 of the protruding part 22 may have a two-step interval L24 change between the upstream and the midstream (wide) and the downstream (narrow), or may have a two-step interval L24 change between the upstream (wide) and the midstream and the downstream (narrow).

The narrower the interval L24 between the protruding parts 22 is, the narrower the average flow channel height between the protruding part 22 and the top plate 12 per unit length in the flow direction 27 is. Therefore, the narrower the interval L24 between the protruding parts 22 is, the larger the flow velocity can be. In the present example, because the interval L24 of the protruding part 22 is narrower toward the downstream, compared to the case where the intervals L24 of all the protruding parts 22 are the same as the interval L24-3 of the protruding part 22 in the downstream, it is possible to reduce the pressure loss within the refrigerant passing portion 20 and to prevent a deterioration in the cooling efficiency in the downstream.

FIG. 4C shows an example in which inclination angle θ of a front surface 25 of a protruding part 22 changes in a flow direction 27. In the present example, each of the inclination angles, which are defined by the front surface 25 facing the flow from the upstream of the refrigerant 18, and the bottom plate 14, differs from each other in the flow direction 27. An inclination angle θ of a protruding part 22 provided at a position close to the downstream may be larger than an inclination angle θ of a protruding part 22 provided at a position close to the upstream.

In the present example, the inclination angle θ2 of the protruding parts 22 in the midstream is larger than the inclination angle θ1 of the protruding parts 22 in the upstream. Also, the inclination angle θ3 of the protruding parts 22 in the downstream is larger than the inclination angle θ2 of the protruding parts 22 in the midstream. Furthermore, the inclination angle θ3 of the protruding parts 22 in the downstream is larger than the inclination angle θ1 of the protruding parts 22 in the upstream. For example, θ1, θ2, and θ3 satisfy 20 degrees$<=$θ1$<$θ2$<$θ3$<=$90 degrees.

The inclination angle θ of the protruding part 22 may gradually increase from the upstream toward the downstream. Also, the inclination angle θ of the protruding part 22 may be constant within each region in the upstream, in the midstream, and in the downstream, and may increase in a step-by-step manner as it heads to the region in the downstream. Also, the inclination angle θ of the protruding part 22 may have a two-step inclination angle θ change between the upstream and the midstream (inclination angle θ small) and the downstream (inclination angle θ large), or may have a two-step inclination angle θ change between the upstream (inclination angle θ small) and the midstream and the downstream (inclination angle θ large).

Toward the downstream, the larger a vector component heading toward the top plate 12 can be made. Thereby, it is considered that there is an advantage of suppressing deterioration in the cooling function in the downstream. Note that, two examples among the three examples FIGS. 4A, 4B and 4C may be combined, or all the three examples may be combined. Thereby, advantageous effects of the respective examples can be synergistically enjoyed.

Figure 5:
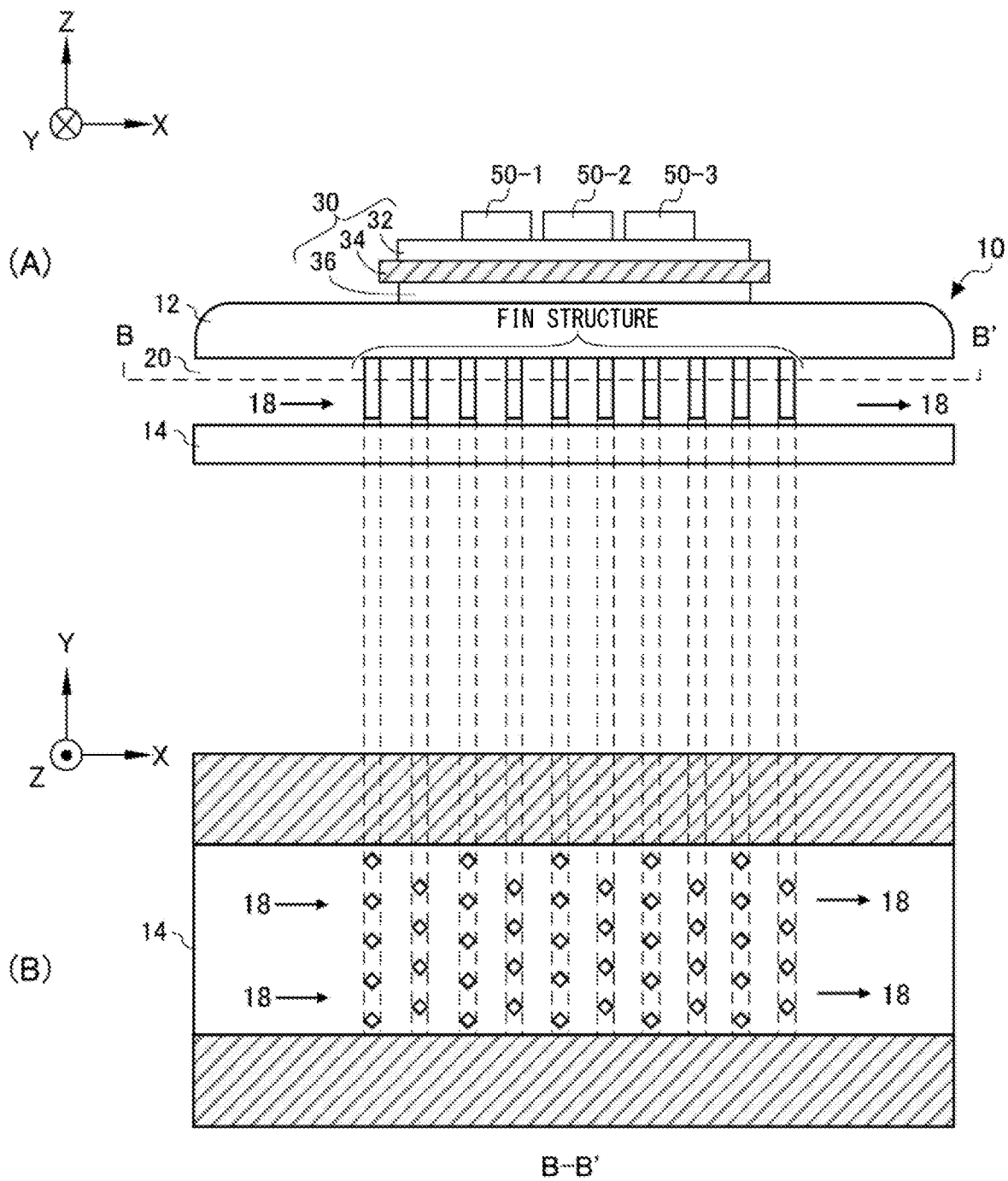
FIG. 5 is a diagram in which (A) is a cross-sectional view of a fin structure of a cooling portion 10 in the comparative example; and
(B) is a top view of a fin structure of a cooling portion 10 in the comparative example.

(A) of FIG. 5 is a cross-sectional view of a fin structure of a cooling portion 10 in the comparative example. (B) of FIG. 5 is a top view of a fin structure of a cooling portion 10 in the comparative example. (B) of FIG. 5 is also a cross-sectional view taken along line B-B' of (A) of FIG. 5. As described above, in the comparative example, the top plate 12 and the fin structure are integrated, however, the top plate 12 and the bottom plate 14 are constituted separately, and are not integrated. In the comparative example, a fin which is linearly provided in the width direction 28 is provided so as to be deviated by a half-pitch in the flow direction 27. The refrigerant 18 may mainly exchange heat with the metallic fin. Thereby, the cooling portion 10 may cool the semiconductor chip 50.

Figure 6:
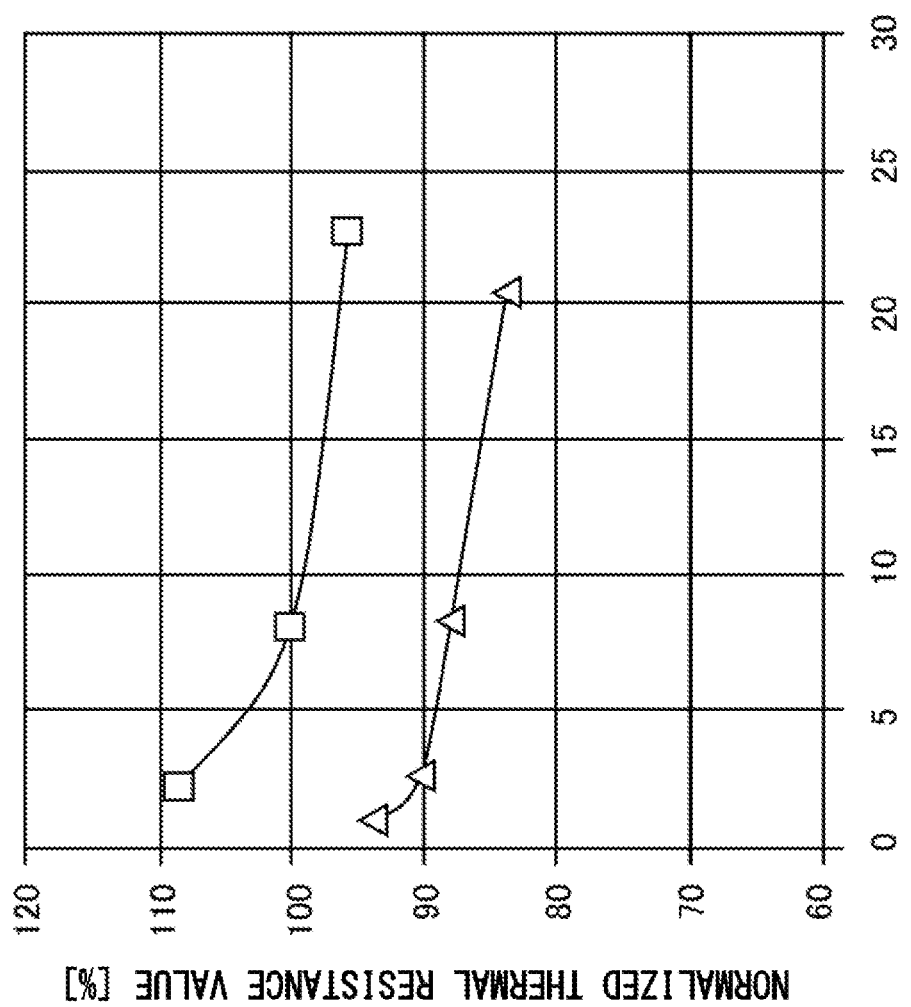
FIG. 6 is an experimental result in which thermal resistance value of the present example and thermal resistance value of the comparative example are compared.

FIG. 6 is an experimental result in which thermal resistance values of the present example and thermal resistance values of the comparative example are compared. The vertical axis is the normalized thermal resistance value [%]. In FIG. 6, the thermal resistance value is normalized by the thermal resistance value of the semiconductor chip 50 when the pressure loss is 8 [kPa] in the above-described comparative example. Therefore, the vertical axis is shown as percentage [%]. In FIG. 6, it is meant that the larger the numerical value on the vertical axis is, the lower the cooling function of the cooling portion 10 is. The horizontal axis is the pressure loss [kPa] generated in the refrigerant passing portion 20. In the structure of the same cooling portion 10, it is meant that the larger the pressure loss [kPa] is, the larger the flow velocity of the refrigerant 18 is. As is apparent from FIG. 6, in the present example, the thermal resistance ratio could be reduced by 10% or more compared to the comparative example, in a range of a pressure loss of 1 kPa or more and 20 kPa or less, particularly 4 kPa or more and 12 kPa or less.

Figure 7A:
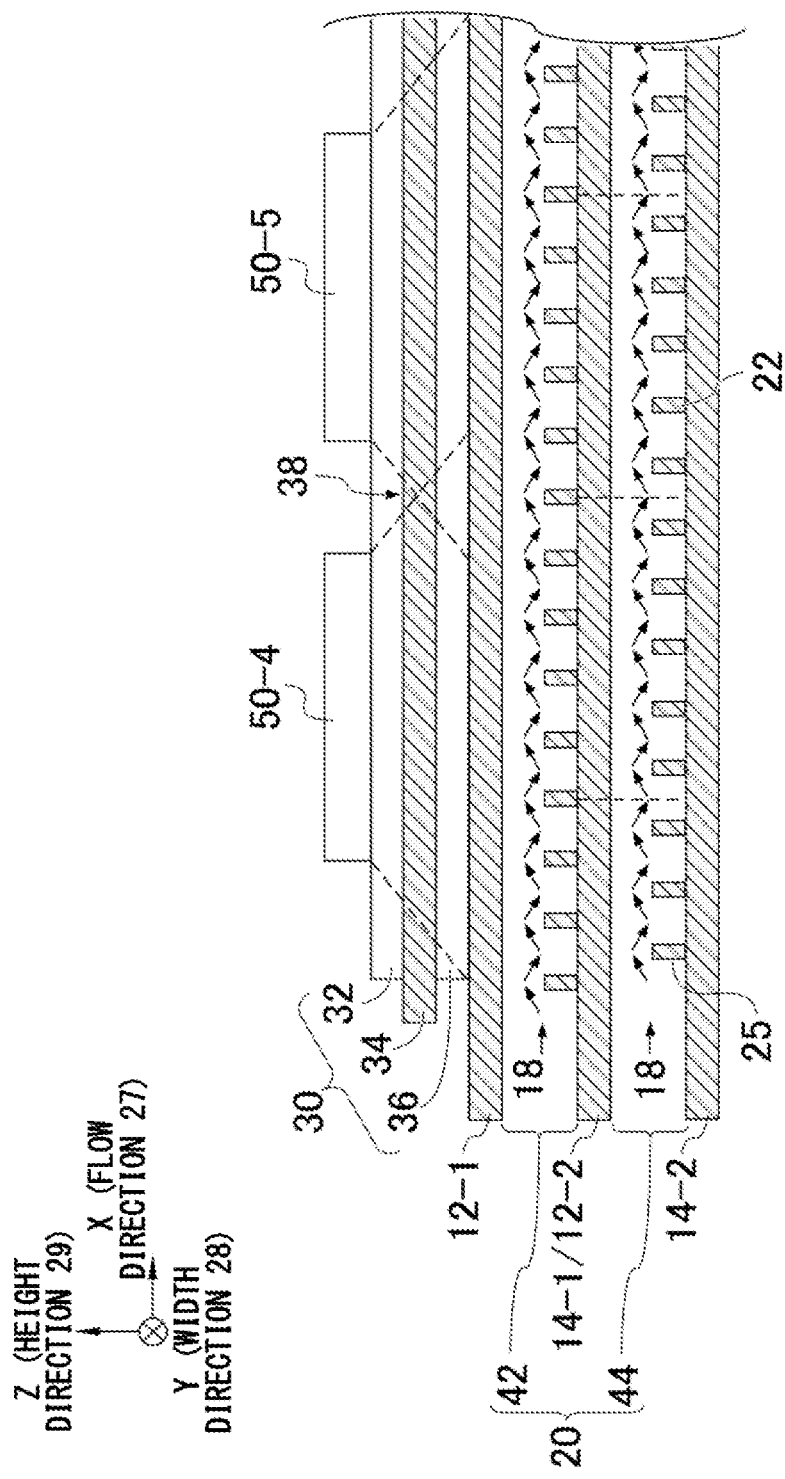
FIG. 7A is a cross-sectional view taken along line A-A' in a second embodiment.

FIG. 7A is a cross-sectional view taken along line A-A' in a second embodiment. The refrigerant passing portion 20 of the present example has an upper refrigerant passing portion 42 and a lower refrigerant passing portion 44. The upper refrigerant passing portion 42 may be provided above the lower refrigerant passing portion 44 in the height direction 29. Although this example is mainly different from the first embodiment in this respect, the first embodiment or a combination of the first embodiment and a modification example of the first embodiment may be applied to this example in other respects. Any one or more of (a) the height H23 of the protruding part 22, (b) the interval L24 of the protruding part 22, and (c) the inclination angle θ of the front surface 25 in the protruding part 22 in a modification example of the first embodiment may be applied to the present example.

The upper refrigerant passing portion 42 is provided at a position relatively close to the second metal interconnection layer 36 in the height direction 29. The upper refrigerant passing portion 42 may exchange heat with the laminated substrate 30, and may exchange heat with the lower refrigerant passing portion 44. The lower refrigerant passing portion 44 may be provided overlapping under the upper refrigerant passing portion 42. The lower refrigerant passing portion 44 may exchange heat with the upper refrigerant passing portion 42. In the present example, cooling efficiency of the cooling portion 10 can be improved compared to the first embodiment.

The upper refrigerant passing portion 42 and the lower refrigerant passing portion 44 of the present example respectively have a plurality of protruding parts 22. In the present example, the plurality of protruding parts 22 in the upper refrigerant passing portion 42 and the plurality of protruding parts 22 in the lower refrigerant passing portion 44 do not overlap with each other in the height direction 29. In the present example, the protruding part 22 of the lower refrigerant passing portion 44 can be arranged immediately below the opening portion 26 in the upper refrigerant passing portion 42. Thereby, the refrigerant 18 heading from the top plate 12 toward the bottom plate 14 after being warmed in the upper refrigerant passing portion 42 can be cooled at the upper portion of each protruding part 22 of the lower refrigerant passing portion 44. In this way, efficient cooling can be realized between the upper refrigerant passing portion 42 and the lower refrigerant passing portion 44.

Note that, in the present example, although the bottom plate 14-1 of the upper refrigerant passing portion 42 also serves as the top plate 12-2 of the lower refrigerant passing portion 44, the bottom plate 14-1 of the upper refrigerant passing portion 42 and the top plate 12-2 of the lower refrigerant passing portion 44 may be individually provided. Also, in the present example, although the upper refrigerant passing portion 42 and the lower refrigerant passing portion 44 constitute two independent flow channels, by providing a through hole in the bottom plate 14-1, the refrigerant 18 itself may be exchanged between the upper refrigerant passing portion 42 and the lower refrigerant passing portion 44.

Figure 7B:
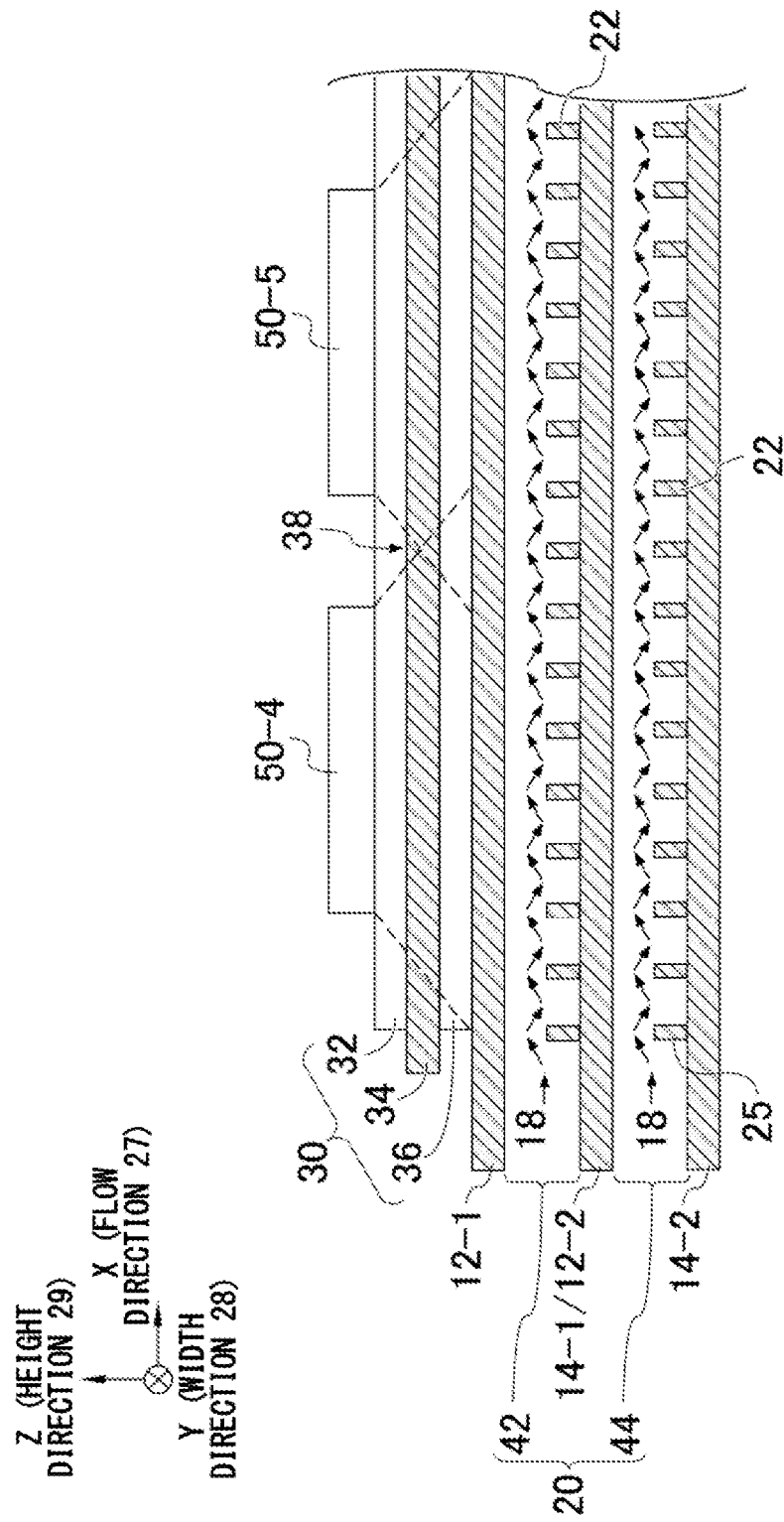
FIG. 7B is a cross-sectional view taken along line A-A in a modification example of a second embodiment.

FIG. 7B is a cross-sectional view taken along line A-A' in a modification example of a second embodiment. Each of the plurality of protruding parts 22 in the upper refrigerant passing portion 42 and each of the plurality of protruding parts 22 in the lower refrigerant passing portion 44 may overlap with each other in the height direction 29. In the present example, the protruding part 22 in the upper refrigerant passing portion 42 and the protruding part 22 in the lower refrigerant passing portion 44 completely overlap with each other in the height direction 29. That is, the positions of the protruding parts 22 in the flow direction 27 and the positions of the protruding parts 22 in the width direction 28 are the same in the upper refrigerant passing portion 42 and the lower refrigerant passing portion 44. However, due to an error caused by at least one of the manufacturing and arrangement of the plate with openings 120, the protruding part 22 of the upper refrigerant passing portion 42 and the protruding part 22 of the lower refrigerant passing portion 44 may not overlap with each other completely. That is, they may overlap with each other being somewhat deviated. Although the present example is different from the second embodiment in this respect, it may be the same as the second embodiment in other respects.

In the present example, in the upper refrigerant passing portion 42 and the lower refrigerant passing portion 44, the cooling portion 10 can be manufactured using the same plate with openings 120. Therefore, the present example is advantageous with respect to the component cost and assembling cost of the cooling portion 10. Note that, also in the present example, by providing a through hole in the bottom plate 14-1, the refrigerant 18 itself may be exchanged between the upper refrigerant passing portion 42 and the lower refrigerant passing portion 44.

Figure 8:
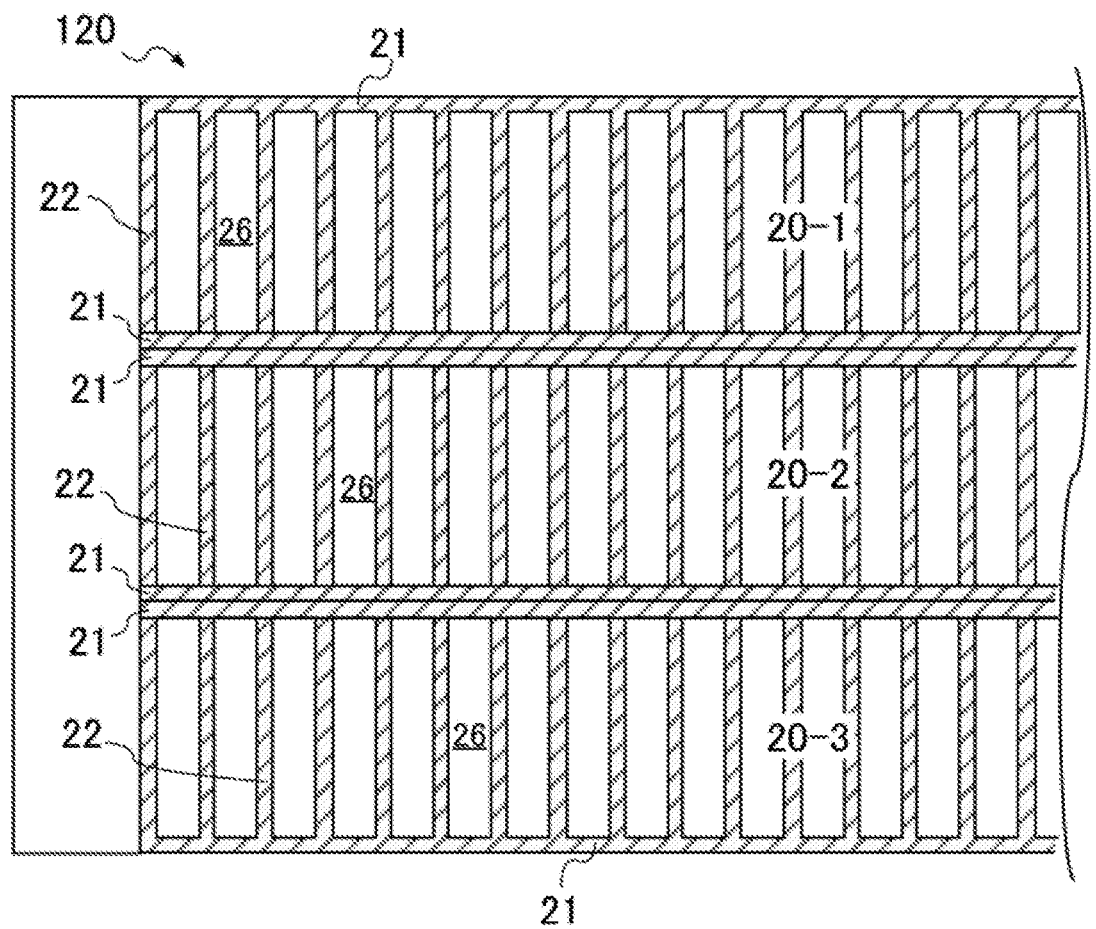
FIG. 8 is a top view of a refrigerant passing portion 20 in a third embodiment.

FIG. 8 is a top view of a refrigerant passing portion 20 in a third embodiment. FIG. 8 corresponds to (B) of FIG. 2. In the present example, the side portion 21 which is not located at the end portions in the width direction 28 (that is, the side portion 21 which is located near the center in the width direction 28) is provided extending from the bottom plate 14 to the top plate 12 in the height direction 29. Thereby, the side portion 21 located near the center in the width direction 28 may divide the refrigerant passing portion 20 into a plurality of independent regions in the width direction 28. In the present example, the side portions 21 located near the center in the width direction 28 divide the refrigerant passing portion 20 into three regions, that is, the refrigerant passing portions 20-1, 20-2, and 20-3, in the width direction 28. With the configuration, the refrigerant 18 itself of the present example may not be exchanged with each other in the width direction 28 inside the refrigerant passing portion 20.

Each of the protruding parts 22 of the present example is also continuous in the width direction 28 within each independent region. In the present example in which the refrigerant passing portion 20 is divided into a plurality of independent regions in the width direction 28 by the side portions 21, the fact that each of the protruding parts 22 is continuous in the width direction 28 means that each of the protruding parts 22 in each independent region is continuous in the width direction 28. In the present example, when using a pump having the same displacement of the refrigerant 18 as in the first embodiment, the pressure loss in the cooling portion 10 increases, but the flow velocity of the refrigerant 18 within the refrigerant passing portion 20 can be increased compared to the first embodiment. Note that, any one or more of (a) the height H23 of the protruding part 22, (b) the interval L24 of the protruding part 22, and (c) the inclination angle θ of the front surface 25 in the protruding part 22 in a modification example of the first embodiment may be applied to the present example. Furthermore, in addition to or besides the modification example of the first embodiment, the present example and the second embodiment may be combined.

Figure 9:
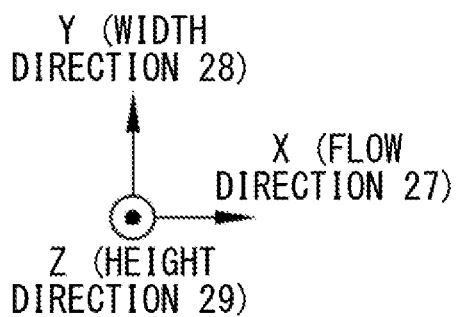
FIG. 9 is a top view of a refrigerant passing portion 20 in a fourth embodiment.
Figure 9:
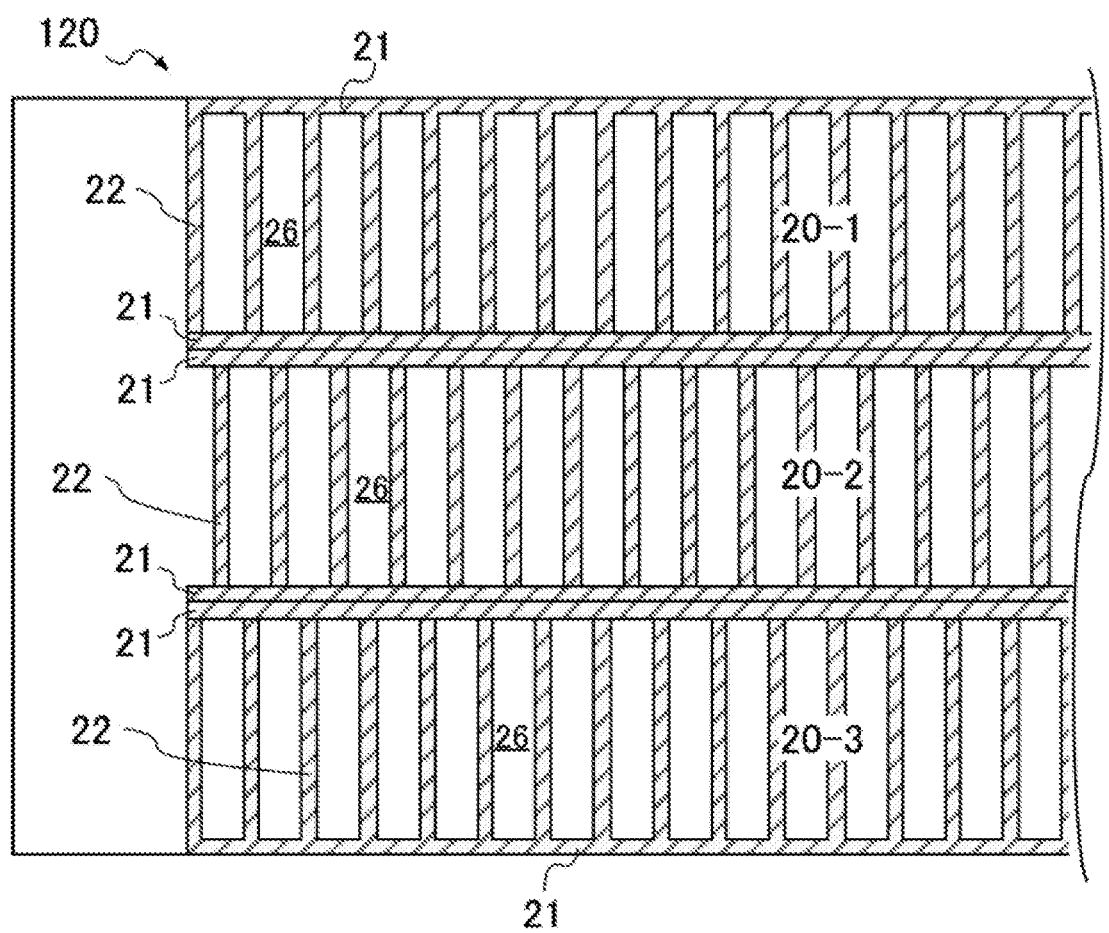

FIG. 9 is a top view of a refrigerant passing portion 20 in a fourth embodiment. FIG. 9 corresponds to (B) of FIG. 2. In the present example, the arrangement of the opening portions 26 provided in the refrigerant passing portion 20 is different from that of the example of FIG. 8. In the present example, the opening portion 26 of the refrigerant passing portion 20-2 is provided so as to be deviated in the flow direction 27 compared to the opening portions 26 of the refrigerant passing portions 20-1 and 20-3. The amount of deviation may be half of the length of the opening portion 26 in the flow direction 27. Also in the present example, each of the plurality of protruding parts 22 is continuously provided in the width direction 28. Also in the present example, a refrigerant passing portion 20 is divided into a plurality of independent regions in the width direction 28 (refrigerant passing portions 20-1, 20-2, and 20-3) by the side portions 21 located near the center in the width direction 28.

Each of the protruding parts 22 of the present example is also continuous in the width direction 28 within each independent region. Also in the present example, the same advantageous effects as the first embodiment can be obtained. Also, any one or more of (a) the height H23 of the protruding part 22, (b) the interval L24 of the protruding part 22, and (c) the inclination angle θ of the front surface 25 in the protruding part 22 in a modification example of the first embodiment may be applied to the present example. Furthermore, in addition to or besides the modification example of the first embodiment, the present example and the second embodiment may be combined.

Figure 10A:
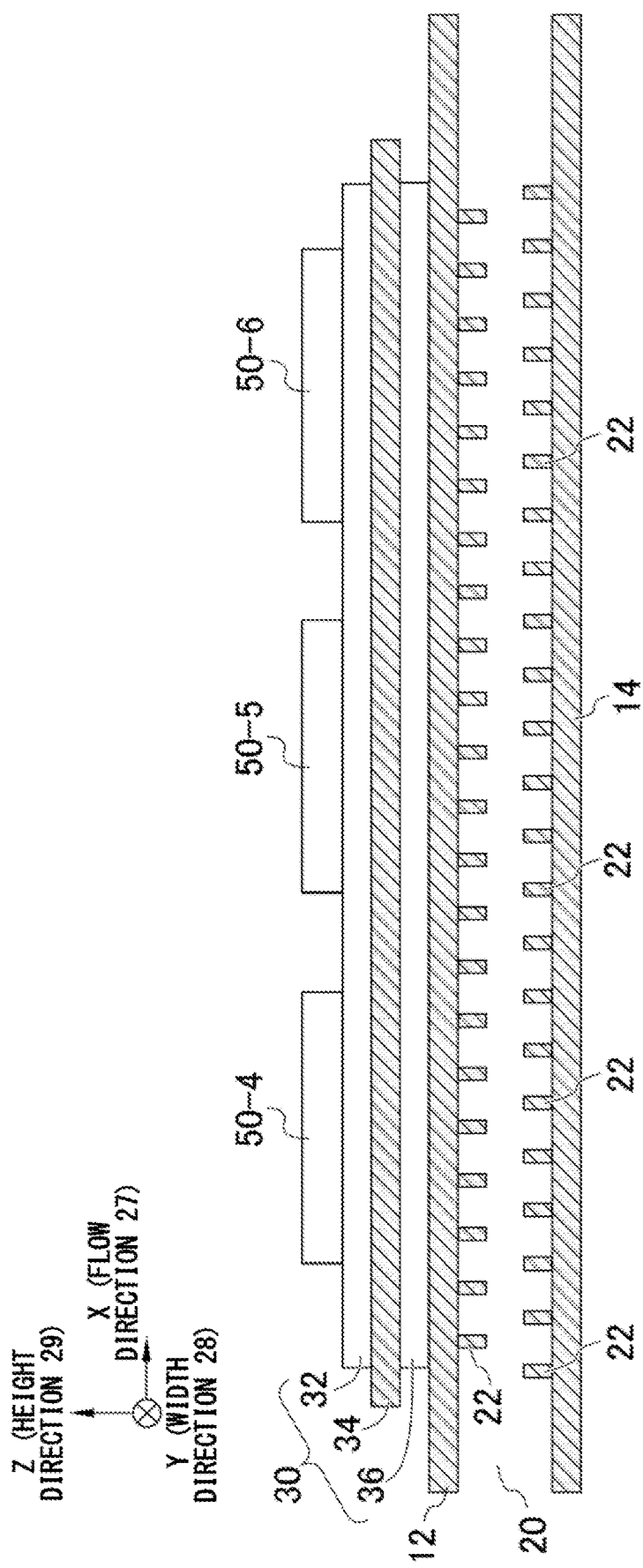
FIG. 10A is a cross-sectional view taken along line A-A in a fifth embodiment.

FIG. 10A is a cross-sectional view taken along line A-A' in a fifth embodiment. The plurality of protruding parts 22 in the present example are provided also on a surface of the top plate 12 contacting the refrigerant passing portion 20. The plurality of protruding parts 22 provided on the top plate 12 may also be continuous in the width direction 28. The plurality of protruding parts 22 provided on the top plate 12 may also be separated from each other in the flow direction 27, and may be provided at 2.4 mm intervals in the flow direction 27.

The plurality of protruding parts 22 provided on the top plate 12 may be a part of the plate with openings 120 provided on the top plate 12. Also, the plate with openings 120 provided on the top plate 12 may be configured integrally with the plate with openings 120 provided on the bottom plate 14. The case where both are configured integrally may be advantageous with respect to the assembling cost of the cooling portion 10 compared to the case where both are individually configured.

The plurality of protruding parts 22 provided on the top plate 12 and the plurality of protruding parts 22 provided on the bottom plate 14 may not overlap with each other in the height direction 29. In the present example, each of the plurality of protruding parts 22 provided on the top plate 12 is provided between two adjacent protruding parts 22 in the flow direction 27 among the plurality of protruding parts 22 provided on the bottom plate 14. In one example, the plurality of protruding parts 22 provided on the top plate 12 may be provided so as to be deviated by a half-pitch in the flow direction 27 with respect to the plurality of protruding parts 22 provided on the bottom plate 14. The half-pitch may mean half the distance between the two adjacent protruding parts 22 in the flow direction 27 among the plurality of protruding parts 22 provided on the bottom plate 14.

The refrigerant passing portion 20 may have a region in which a plurality of protruding parts 22 provided on the top plate 12 and a plurality of protruding parts 22 provided on the bottom plate 14 do not overlap with each other in the flow direction 27. However, in another example, the plurality of protruding parts 22 provided on the top plate 12 and the plurality of protruding parts 22 provided on the bottom plate 14 may overlap with each other in the flow direction 27. In either case, a part of the refrigerant 18 may flow alternately toward the top plate 12 and toward the bottom plate 14, by alternately colliding with the front surface 25 of the protruding part 22 of the bottom plate 14 and the front surface 25 of the protruding part 22 of the top plate 12. As a result, the flow of the refrigerant 18 has a vector component oriented in the height direction 29 by a predetermined angle with respect to the flow direction 27, and has a vector component oriented in a direction opposite to the height direction 29 by a predetermined angle with respect to the flow direction 27.

Also in the present example, the refrigerant 18 can more efficiently cool the laminated substrate 30 and the semiconductor chip 50, compared to the case where the entire refrigerant 18 flows in parallel with the flow direction 27. In the present example, although the pressure loss may increase compared to the first embodiment, the flow velocity of the refrigerant 18 can be increased compared to that of the first embodiment. Also, also in the present example, similar advantageous effects can be enjoyed about the configuration similar to that of the first embodiment.

Also, any one or more of (a) the height H23 of the protruding part 22, (b) the interval L24 of the protruding part 22, and (c) the inclination angle θ of the front surface 25 in the protruding part 22 in a modification example of the first embodiment may be applied to the present example. Furthermore, in addition to or besides the modification example of the first embodiment, the present example and the second embodiment may be combined, or the present example and the third embodiment or the fourth embodiment may be combined.

Figure 10B:
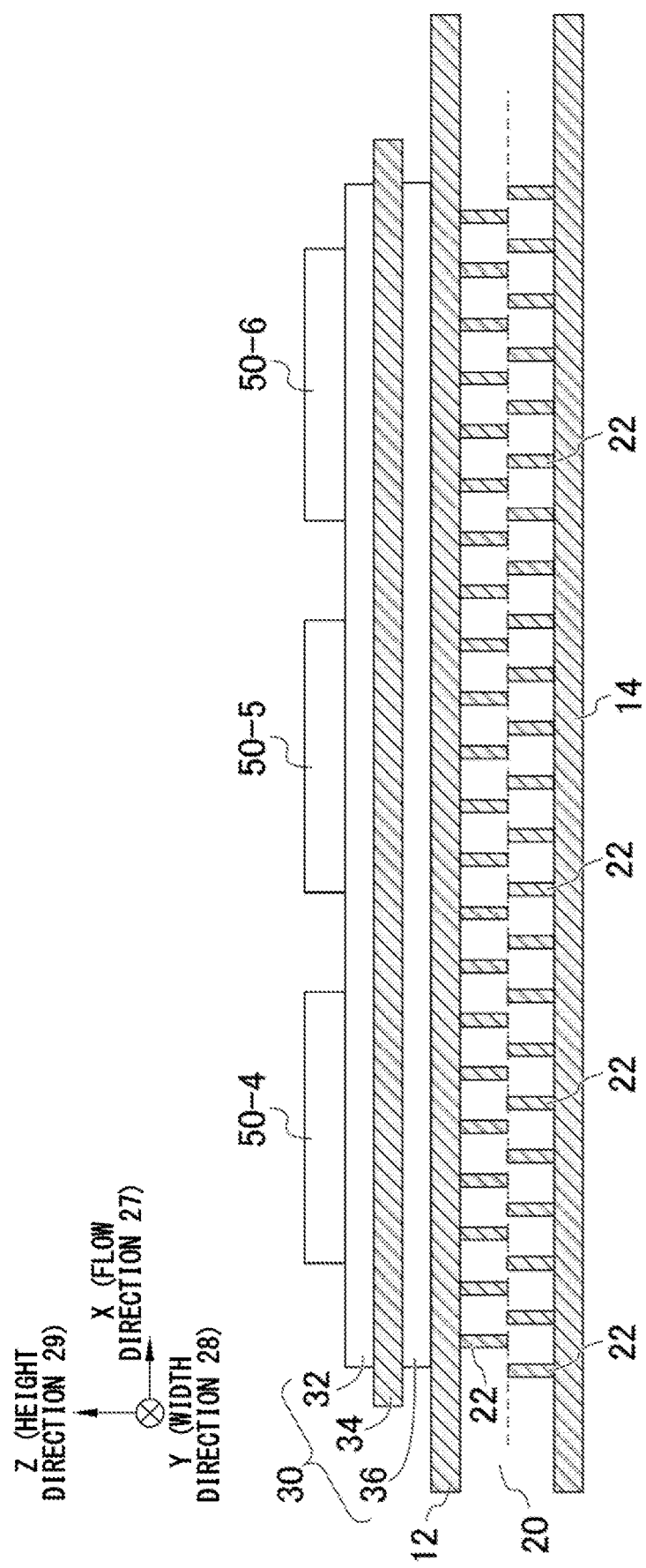
FIG. 10B is a cross-sectional view taken along line A-A' in a first modification example of a fifth embodiment.

FIG. 10B is a cross-sectional view taken along line A-A' in a first modification example of a fifth embodiment. In the present example, the lower end of the protruding part 22 provided on the top plate 12 and the upper end of the protruding part 22 provided on the bottom plate 14 are the same in the height direction 29. Note that, in the present example, the lower end of the protruding part 22 on the top plate 12 and the upper end of the protruding part 22 on the bottom plate 14 are the same at the midpoint of the height direction 29 of the refrigerant passing portion 20. The midpoint of the height direction 29 of the refrigerant passing portion 20 is indicated by dotted lines. In the refrigerant passing portion 20 of the present example, the refrigerant 18 cannot go straight in the flow direction 27. Although the present example is different from the example in FIG. 10A in this respect, the same advantageous effect as the example in FIG. 10A can be obtained also in the present example. Note that, in another example, the position at which the lower end of the protruding part 22 on the top plate 12 and the upper end of the protruding part 22 on the bottom plate 14 are the same in the height direction 29 may be closer to the top plate 12 than the above-described midpoint, or may also be closer to the bottom plate 14 than the above-described midpoint.

Figure 10C:
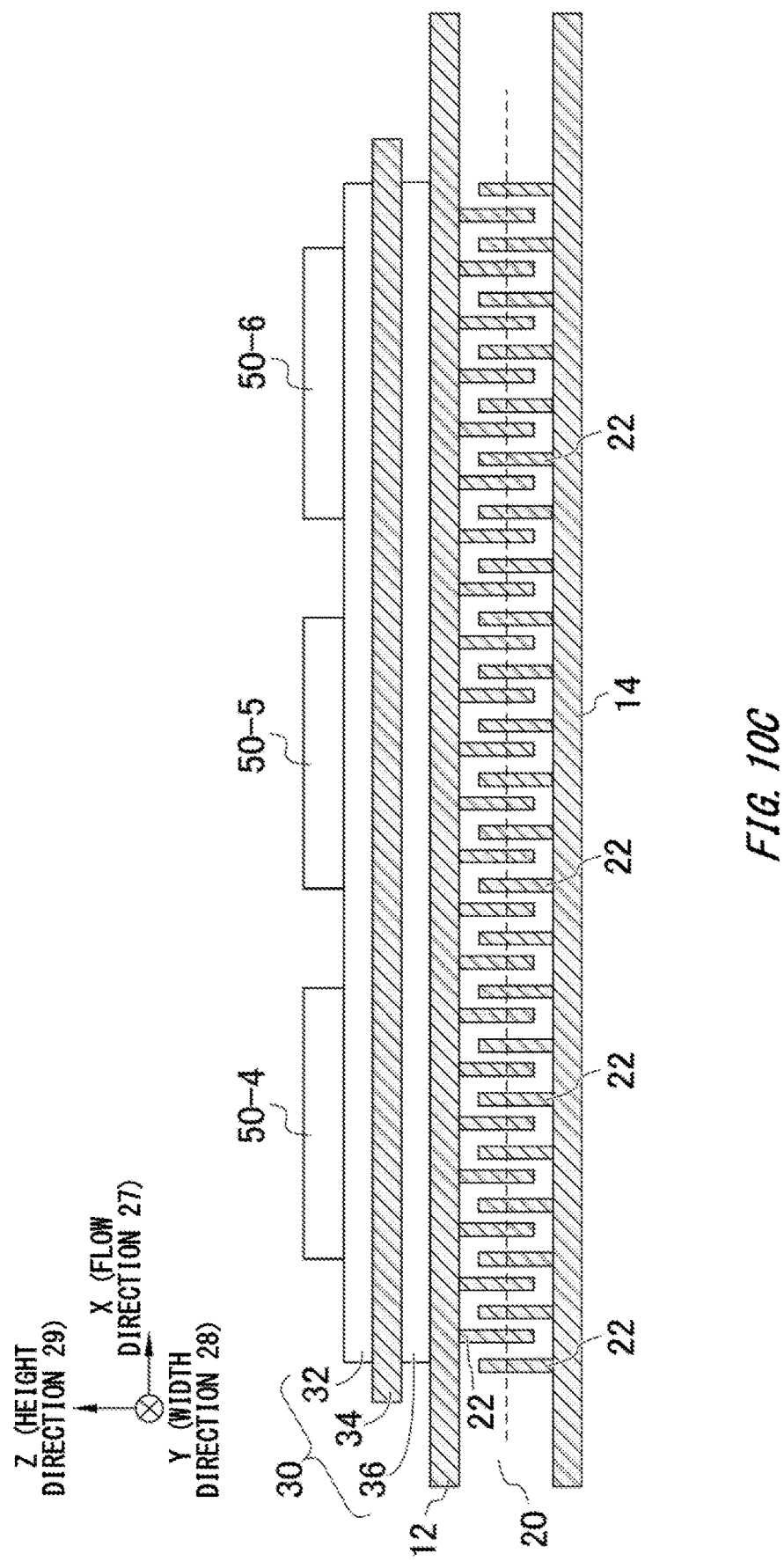
FIG. 10C is a cross-sectional view taken along line A-A' in a second modification example of a fifth embodiment.

FIG. 10C is a cross-sectional view taken along line A-A' in a second modification example of a fifth embodiment. In the present example, the protruding part 22 provided on the top plate 12 and the protruding part 22 provided on the bottom plate 14 are arranged so as to be engaged with each other. That is, in the present example, the lower end of the protruding part 22 provided on the top plate 12 is located below the upper end of the protruding part 22 provided on the bottom plate 14. In other words, the upper end of the protruding part 22 provided on the bottom plate 14 is located above the lower end of the protruding part 22 provided on the top plate 12. Note that, the dotted lines indicate the midpoint of the height direction 29 of the refrigerant passing portion 20, like in the example in FIG. 10B. Also in the present example, the refrigerant 18 cannot go straight in the flow direction 27 inside the refrigerant passing portion 20.

Although the present example is different from the example in FIG. 10A in this respect, the same advantageous effect as the example in FIG. 10A can be obtained also in the present example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module comprising:
   a semiconductor chip;
   a cooling portion having a refrigerant passing portion inside, the refrigerant passing portion through which a refrigerant passes; and
   a laminated substrate having:
      a first metal interconnection layer closer to the semiconductor chip than to the cooling portion;
      a second metal interconnection layer closer to the cooling portion than to the semiconductor chip; and
      an insulation provided between the first metal interconnection layer and the second metal interconnection layer,
   wherein the cooling portion has:
      a top plate provided close to the laminated substrate;
      a bottom plate provided facing the top plate; and
      a plurality of protruding parts which are provided on a surface of the bottom plate contacting the refrigerant passing portion, and are separated from each other in a flow direction from an upstream to a downstream of the refrigerant, and are respectively provided continuously in a width direction of the refrigerant passing portion orthogonal to the flow direction,
   wherein the plurality of protruding parts are at least provided at a position overlapping with one end of the second metal interconnection layer and at a position overlapping with the semiconductor chip in the flow direction.

2. The semiconductor module according to claim 1,
   wherein the second metal interconnection layer is provided on the top plate,
   the insulation is provided above the second metal interconnection layer,
   the first metal interconnection layer is provided above the insulation,
   the semiconductor chip is provided on the first metal interconnection layer.

3. The semiconductor module according to claim 1,
   wherein in two protruding parts among the plurality of protruding parts, height of a protruding part provided at a position close to the downstream is higher than height of a protruding part provided at a position close to the upstream.

4. The semiconductor module according to claim 1,
   wherein an interval between two protruding parts provided at a position close to the downstream among the plurality of protruding parts is narrower than an interval between two protruding parts provided at a position close to the upstream among the plurality of protruding parts.

5. The semiconductor module according to claim 1,
   wherein the plurality of protruding parts respectively have a front surface facing a flow of the refrigerant from the upstream,
   wherein in two protruding parts among the plurality of protruding parts, an inclination angle of the front surface with respect to the bottom plate in a protruding part provided at a position close to the downstream is larger than an inclination angle of the front surface with respect to the bottom plate in a protruding part provided at a position close to the upstream.

6. The semiconductor module according to claim 1,
   wherein the cooling portion has:
      an upper refrigerant passing portion which is provided at a position relatively close to the second metal interconnection layer in a height direction from the bottom plate toward the top plate, and has the plurality of protruding parts, and
      a lower refrigerant passing portion which is provided overlapping under the upper refrigerant passing portion in the height direction, and has the plurality of protruding parts.

7. The semiconductor module according to claim 6,
   wherein the plurality of protruding parts in the upper refrigerant passing portion and the plurality of protruding parts in the lower refrigerant passing portion do not overlap with each other in the height direction.

8. The semiconductor module according to claim 6,
   wherein each of the plurality of protruding parts in the upper refrigerant passing portion and each of the plurality of protruding parts in the lower refrigerant passing portion overlap with each other in the height direction.

9. The semiconductor module according to claim 6,
   wherein the upper refrigerant passing portion exchanges heat with the laminated substrate,
   the upper refrigerant passing portion exchanges heat with the lower refrigerant passing portion.

10. The semiconductor module according to claim 6,
    wherein any one or more of following is(are) satisfied;
    (a) in two protruding parts among the plurality of protruding parts in the upper refrigerant passing portion, height of a protruding part provided at a position close to the downstream is higher than height of a protruding part provided at a position close to the upstream;
    (b) an interval between two protruding parts provided at a position close to the downstream among the plurality of protruding parts in the upper refrigerant passing portion is narrower than an interval between two protruding parts provided at a position close to the upstream among the plurality of protruding parts in the upper refrigerant passing portion; and
    (c) each of the plurality of protruding parts has a front surface facing a flow of the refrigerant from the upstream, in two protruding parts among the plurality of protruding parts in the upper refrigerant passing portion, an inclination angle of the front surface with respect to the bottom plate in a protruding part provided at a position close to the downstream is larger than an inclination angle of the front surface with respect to the bottom plate in a protruding part provided at a position close to the upstream.

11. The semiconductor module according to claim 1,
    wherein the semiconductor chip is an RC-IGBT semiconductor chip having an IGBT region and an FWD region which are provided in a stripe shape, and wherein an extending direction of the plurality of protruding parts in the width direction is parallel to a longitudinal direction of the IGBT region and the FWD region.

12. The semiconductor module according to claim 1, further comprising an additional semiconductor chip at a position different from the semiconductor chip in the flow direction,
   wherein at least one of the plurality of protruding parts is(are) provided between the semiconductor chip and the additional semiconductor chip.

13. The semiconductor module according to claim 1, wherein in the cooling portion, the top plate and the bottom plate are integrated via side plates provided between the top plate and the bottom plate in a height direction from the bottom plate toward the top plate.

14. The semiconductor module according to claim 1, wherein thickness of the first metal interconnection layer and the second metal interconnection layer are 0.6 mm or more.

* * * * *